(12) United States Patent
Ikeda et al.

(10) Patent No.: US 9,805,659 B2
(45) Date of Patent: Oct. 31, 2017

(54) DATA PROCESSING DEVICE

(71) Applicant: Semiconductor Energy Laboratory Co., Ltd., Atsugi-shi, Kanagawa-ken (JP)

(72) Inventors: Hisao Ikeda, Zama (JP); Yoshiaki Oikawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 10 days.

(21) Appl. No.: 14/330,528

(22) Filed: Jul. 14, 2014

(65) Prior Publication Data

US 2015/0022515 A1    Jan. 22, 2015

(30) Foreign Application Priority Data

Jul. 19, 2013   (JP) .................................. 2013-150586

(51) Int. Cl.
   *G09G 3/3275*     (2016.01)
   *G09G 3/3233*     (2016.01)

(52) U.S. Cl.
   CPC ......... *G09G 3/3275* (2013.01); *G09G 3/3233* (2013.01); *G09G 2300/0426* (2013.01);
   (Continued)

(58) Field of Classification Search
   CPC .................................................. G09G 3/3275
   See application file for complete search history.

(56) References Cited

U.S. PATENT DOCUMENTS 7,027,110 B2   4/2006 Akiyama et al.
7,053,874 B2   5/2006 Koyama
(Continued)

FOREIGN PATENT DOCUMENTS

CN    101326561 A    12/2008
JP    2002-278515 A    9/2002
(Continued)

OTHER PUBLICATIONS

Written Opinion (Application No. PCT/JP2014/068375) Dated Oct. 7, 2014.
(Continued)

*Primary Examiner* — Charles Hicks
(74) *Attorney, Agent, or Firm* — Robinson Intellectual Property Law Office; Eric J. Robinson

(57) ABSTRACT

To provide a highly browsable data processing device, provide a highly portable data processing device, provide a data processing device which consumes low power, or provide a data processing device having high display quality, the data processing device includes a display portion having flexibility, a plurality of driver circuit portions arranged in the periphery of the display portion, a sensor portion discerning an external state of the display portion, an arithmetic portion supplying image data to the driver circuit portions, and a memory portion storing a program executed by the arithmetic portion. A first mode in which the display portion is unfolded or a second mode in which the display portion is folded is sensed by the sensor. Low power consumption processing and degradation correction processing are carried out by the program in accordance with the first mode or the second mode.

10 Claims, 25 Drawing Sheets

(52) U.S. Cl.
CPC ............ *G09G 2310/0221* (2013.01); *G09G 2310/0281* (2013.01); *G09G 2320/0686* (2013.01); *G09G 2330/021* (2013.01); *G09G 2380/02* (2013.01)

(56) References Cited

U.S. PATENT DOCUMENTS

| | | | |
|---|---|---|---|
| 8,415,208 B2 | 4/2013 | Takayama et al. | |
| 8,803,816 B2 | 8/2014 | Kilpatrick, II et al. | |
| 2002/0033783 A1* | 3/2002 | Koyama ............... | G09G 3/3233 345/82 |
| 2004/0150594 A1 | 8/2004 | Koyama et al. | |
| 2004/0239586 A1* | 12/2004 | Cok ..................... | G09G 3/3266 345/55 |
| 2009/0231252 A1 | 9/2009 | Maegawa | |
| 2009/0237390 A1 | 9/2009 | Koyama et al. | |
| 2011/0095974 A1 | 4/2011 | Moriwaki | |
| 2011/0102390 A1 | 5/2011 | Moriwaki | |
| 2011/0241998 A1* | 10/2011 | McKinney ............ | G06F 1/1616 345/168 |
| 2015/0009128 A1 | 1/2015 | Matsumoto | |
| 2015/0015613 A1 | 1/2015 | Iwaki | |
| 2015/0016126 A1 | 1/2015 | Hirakata et al. | |
| 2015/0022561 A1 | 1/2015 | Ikeda et al. | |

FOREIGN PATENT DOCUMENTS

| | | |
|---|---|---|
| JP | 2003-174153 | 6/2003 |
| JP | 2005-165129 A | 6/2005 |
| JP | 2006-243621 A | 9/2006 |
| JP | 2007-286602 A | 11/2007 |
| JP | 2010-099122 A | 5/2010 |
| JP | 2011-209576 A | 10/2011 |
| WO | WO-2007/111382 | 10/2007 |

OTHER PUBLICATIONS

International Search Report (Application No. PCT/JP2014/068375) Dated Oct. 7, 2014.

* cited by examiner

DATA PROCESSING DEVICE

TECHNICAL FIELD

The present invention relates to an object, a method, or a manufacturing method. In addition, the present invention relates to a process, a machine, manufacture, or a composition of matter. In particular, the present invention relates to, for example, a human interface, a semiconductor device, a display device, a light-emitting device, a lighting device, a power storage device, a driving method thereof, or a manufacturing method thereof. In particular, the present invention relates to, for example, a method and a program for processing and displaying image data, and a device including a recording medium in which the program is recorded. In particular, the present invention relates to, for example, a method for processing and displaying image data by which an image including data processed by a data processing device provided with a display portion is displayed, a program for displaying an image including data processed by a data processing device provided with a display portion, and a data processing device including a recording medium in which the program is recorded.

BACKGROUND ART

The social infrastructures relating to means for transmitting information have advanced. This has made it possible to acquire, process, and send out many pieces and various kinds of information with the use of a data processing device not only at home or office but also at other visiting places.

With this being the situation, portable data processing devices are under active development.

For example, a flexible active matrix light-emitting device in which an organic EL element or a transistor serving as a switching element is provided over a film substrate is disclosed as an example of a portable data processing device (see Patent Document 1).

REFERENCE

Patent Document

[Patent Document 1] Japanese Published Patent Application No. 2003-174153

DISCLOSURE OF INVENTION

Display devices with large screens on which much information can be displayed are excellent in browsability. Therefore, such display devices are suitable for data processing device.

On the other hand, the display devices with large screens deteriorate in portability compared to display devices with small screens. Furthermore, the display devices with large screens have higher power consumption than display devices with small screens.

Moreover, display quality of the display devices deteriorates in some cases. For example, in the case where light-emitting elements are used in the display device, light-emitting characteristics of the light-emitting elements deteriorate depending on emission intensity or emission times. Therefore, in the case where emission intensity or an emission time is different every pixel, difference of the light-emitting elements in deterioration is observed as display unevenness, resulting in low display quality.

In view of the above problem, one object of one embodiment of the present invention is to provide a highly browsable data processing device or the like. Alternatively, another object is to provide a highly portable data processing device or the like. Another object is to provide a data processing device or the like which consumes low power. Another object is to provide a data processing device or the like having high display quality. Another object is to provide a data processing device or the like having less display unevenness. Another object is to provide a novel data processing device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a data processing device including a display portion having flexibility, a plurality of driver circuit portions arranged in the periphery of the display portion, a sensor portion discerning an external state of the display portion, an arithmetic portion supplying image data to the driver circuit portions, and a memory portion storing a program executed by the arithmetic portion. A first mode in which the display portion is unfolded or a second mode in which the display portion is folded is sensed by the sensor. Low power consumption processing and degradation correction processing are carried out by the program in accordance with the first mode or the second mode.

The program stored by the data processing device of one embodiment of the present invention includes a first step of specifying the external state, a second step in which the program proceeds to a fourth step in the case of the first mode or a third step in the case of a mode other than the first mode, the third step in which the program proceeds to a fifth step in the case of the second mode or the first step in the case of a mode other than the second mode, the fourth step in which the program proceeds to a sixth step in the case where the degradation correction processing is necessary or a seventh step in the case where the degradation correction processing is not necessary, the fifth step of carrying out the low power consumption processing, the sixth step of carrying out the degradation correction processing, and the seventh step of terminating the program. The low power consumption processing includes an eighth step of deciding a non-display region, a ninth step of stopping at least one driver circuit portion, a tenth step of measuring time during which at least one driver circuit portion is stopped, an eleventh step in which the program proceeds to a twelfth step in the case where the low power consumption processing is canceled or the ninth step in the case where the low power consumption processing is not canceled, and the twelfth step of recovering from the low power consumption processing to the program. The degradation correction processing includes a thirteenth step of specifying time of the display region subjected to the low power consumption processing, a fourteenth step of controlling the amount of current flowing through the display region subjected to the low power consumption processing, a fifteenth step in which the program proceeds to a sixteenth step in the case where the degradation correction processing is canceled or the fourteenth step in the case where the degradation correction processing is not canceled, and the sixteenth step of recovering from the degradation correction processing to the program.

In each of the above structures, it is preferable that drivers of the driver circuit portion be independently formed in regions other than a folded region. Accordingly, the low power consumption processing and the degradation correction processing can be preferably carried out.

In this manner, in the data processing device of one embodiment of the present invention, the low power consumption processing and the degradation correction processing are carried out by the program in accordance with the first mode or the second mode, whereby display unevenness of the display portion and power consumption can be suppressed.

According to one embodiment of the present invention, a highly browsable data processing device can be provided. Alternatively, a highly portable data processing device can be provided. Further alternatively, a data processing device which consumes low power can be provided. Further still alternatively, a data processing device having high display quality can be provided.

BEST MODE FOR CARRYING OUT THE INVENTION

Figure 1A:
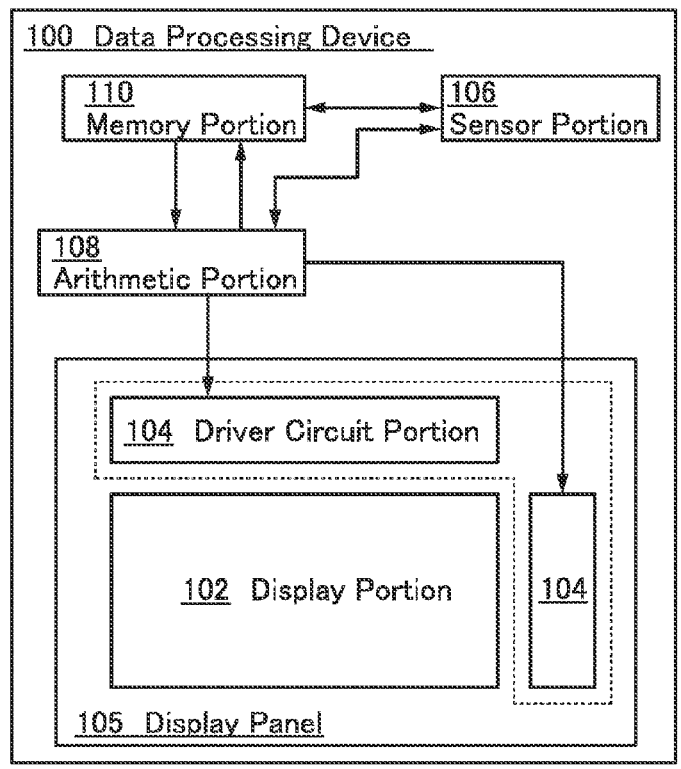
FIGS. 1A and 1B are a block diagram and a top schematic view illustrating a structure of a data processing device.

A data processing device of one embodiment will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Note that the layout of blocks in a block diagram in a drawing specifies the positional relation for description. Thus, even when a drawing shows that different functions are achieved in different blocks, an actual circuit or region may be configured so that the different functions are achieved in the same circuit or region. Furthermore, a function of each block in a block diagram in a drawing is specified for description. Thus, even when one block is illustrated, an actual circuit or region may be configured so that processing which is illustrated as being performed in the one block is performed in a plurality of blocks.

[Embodiment 1]

In this embodiment, a structure of a data processing device of one embodiment of the present invention will be described with reference to FIGS. 1A and 1B, FIGS. 2A and 2B, FIGS. 3A to 3C, FIG. 4, FIGS. 5A and 5B, FIGS. 6A and 6B, FIGS. 7A and 7B, FIGS. 8A and 8B, FIGS. 9A and 9B, FIG. 10, FIGS. 11A and 11B, FIGS. 12A and 12B, FIGS. 13A and 13B, FIG. 14, FIGS. 15A and 15B, FIGS. 16A and 16B, and FIGS. 17A and 17B.

FIG. 1A is a block diagram illustrating the structure of a data processing device 100 of one embodiment of the present invention.

The data processing device 100 shown in FIG. 1A includes a display portion 102 having flexibility, a plurality of driver circuit portions 104 arranged in the periphery of the display portion 102, a sensor portion 106 that discerns the external state of the display portion 102, an arithmetic portion 108 that supplies image data to the driver circuit portion 104, and a memory portion 110 that stores a program executed by the arithmetic portion 108.

Moreover, in FIG. 1A, a display panel 105 is configured by the display portion 102 and the driver circuit portion 104. Note that the display panel 105 may include only the display portion 102, or may be a combination of the display portion 102, the sensor portion 106, the arithmetic portion 108, the memory portion 110, and the like.

Note that also the driver circuit portion 104 can have flexibility by configuring the display panel 105 by the display portion 102 having flexibility and the driver circuit portion 104 as illustrated in FIG. 1A. However, the driver circuit portion 104 does not need to have flexibility by being formed over a substrate different from the substrate over which the display panel 105 is formed.

Since in the data processing device 100 of one embodiment of the present invention in FIG. 1A, the external shape of the display portion 102 having flexibility can be changed, a function of having high browsability and a function of having high portability can be compatible with each other. For example, the data processing device 100 is excellent in browsability in the case where the display portion 102 is unfolded and is excellent in portability in the case where the display portion 102 is folded.

Here, components in FIG. 1A are described below in detail.

<Display Portion>

The display portion 102 is formed over a substrate capable of changing its external shape, for example, a flexible substrate or a flexible film.

<Driver Circuit Portion>

The driver circuit portions 104 are arranged in the periphery of the display portion 102. A signal is supplied from the driver circuit portion 104 to the display portion 102. The driver circuit portion 104 at least needs to drive the display portion 102, for example, in the case where pixels are arranged in matrix in the display portion 102, a circuit (a gate driver) that outputs a signal (a scan signal) for selecting a pixel and a circuit (a source driver) that supplies a signal (a data signal) for driving a display element of the pixel can be used.

Part or all of the driver circuit portions 104 are preferably formed over the same substrate in the same step as the display portion 102. In particular, a gate driver that can be easily formed over the same substrate in the same step as the display portion 102 is preferably provided near a foldable portion. The gate driver has a low operation frequency and is therefore easily formed over the same substrate in the same step as the display portion 102. Thus, the number of components and the number of terminals can be reduced. Moreover, also part or all of the driver circuit portions 104 can have flexibility because the element formed in the same step as the display portion 102 is used. Therefore, the display portion 102 is foldable at an arbitrary place. Accordingly, the data processing device 100 is hardly broken and can be a durable device. The structure of the driver circuit portion 104 is not limited thereto, and for example, the driver circuit portion 104 is not necessarily formed over the same substrate as the display portion 102. In that case, part or all of the driver circuit portions 104 can be mounted by a COG method or a TAB method. When the substrate provided with the display portion 102 is folded in the case where the driver circuit portion 104 is mounted by a COG method or a TAB method, it is preferable not to provide an IC, an LSI, or the like provided by a COG method or a TAB method in a folded region. Accordingly, the substrate provided with the display portion 102 is foldable.

Note that the driver circuit portion 104 may have a function as a protective circuit, a control circuit, a power supply circuit, a signal generation circuit, or the like.

The driver circuit portion 104 may include a plurality of power supply circuits and further the plurality of power supply circuits may be independently controlled such that the display portion 102 is driven in a divisional manner. Alternatively, the driver circuit portion 104 may be configured such that supply of power supply voltage to each of the divided portions of the display portion 102 can be controlled. In addition, a circuit having a function of monitoring the amount of current flowing through a light-emitting element provided in the display portion 102 may be provided in part of the power supply circuit or apart from the power supply circuit. By monitoring the amount of current flowing through the light-emitting element, power consumption in the display portion 102 can be measured. As an example of the amount of the current which is monitored, the amount of current between an anode and a cathode of the light-emitting element provided in the display portion 102 may be monitored.

<Arithmetic Portion>

The arithmetic portion 108 has a function of supplying image data to the driver circuit portion 104.

<Sensor Portion>

The sensor portion 106 has a function capable of discerning the external state of the display portion 102. For example, a first mode in which the display portion 102 is unfolded or a second mode in which the display portion 102 is folded can be sensed. The sensor portion 106 at least needs to discern the external state of the display portion 102 and can be composed of, for example, a switch, a MEMS pressure sensor, an acceleration sensor, an infrared ray sensor, a magnetic sensor, or a pressure-sensitive sensor.

<Memory Portion>

The memory portion 110 stores a program executed by the arithmetic portion 108. The program makes the arithmetic portion 108 execute different processing depending on the data from the sensor portion 106.

Next, a specific structure of the display panel 105 illustrated in FIG. 1A is described below.

Figure 1B:
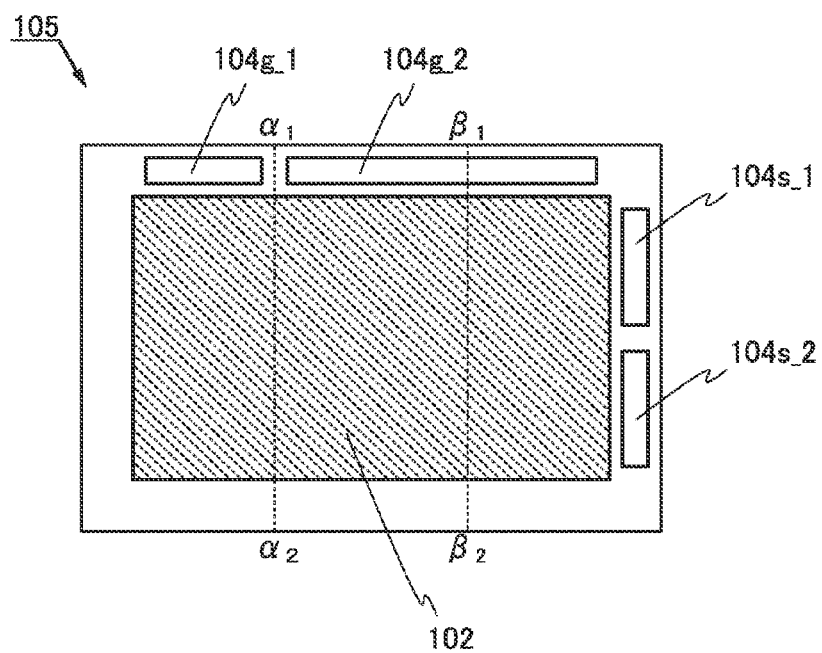

FIG. 1B is a top schematic view illustrating a structure of the display panel 105.

The display panel 105 in FIG. 1B can be folded along dashed lines $\alpha_1$-$\alpha_2$ and $\beta_1$-$\beta_2$. Note that in the case of the structure in FIG. 1B, the display panel 105 can be folded into three parts. However, the structure of the display panel 105 is not limited thereto and the display panel 105 may be folded along one place or three or more places. Note that the dashed lines $\alpha_1$-$\alpha_2$ and $\beta_1$-$\beta_2$, which are the folds, are placed parallel to each other, however, one embodiment of the present invention is not limited thereto. The folds are not necessarily parallel to each other or may cross to each other.

The display panel 105 in FIG. 1B includes the display portion 102 and the driver circuit portion 104 in the periphery of the display portion 102. The driver circuit portion 104 includes a first gate driver 104g_1, a second gate driver 104g_2, a first source driver 104s_1, and a second source driver 104s_2. Note that the first gate driver 104g_1, the first source driver 104s_1, and the second source driver 104s_2 are independently formed in unfolded regions.

Figure 7A:
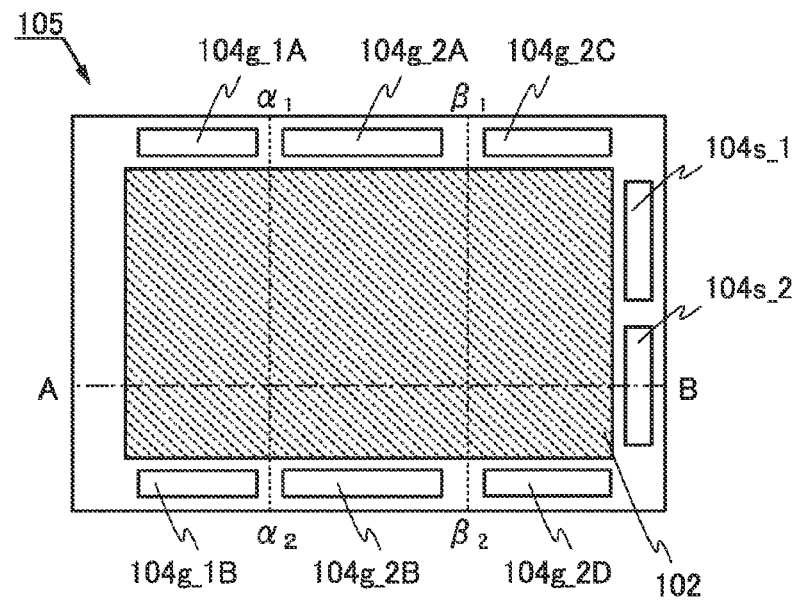
FIGS. 7A and 7B are top schematic views each illustrating a structure of a data processing device.

Although the second gate driver 104g_2 is at this time laid across a folded region, it can be operated without a problem by being formed over the same substrate in the same step as the display portion 102. However, one embodiment of the present invention is not limited thereto and as shown in FIG. 7A, for example, gate drivers (gate drivers 104g_1A and 104g_1B, gate drivers 104g_2A and 104g_2B, gate drivers 104g_2C and 104g_2D, and the like) may be arranged on both the sides of the display portion 102 or only one source driver may be provided. Alternatively, source drivers may be arranged at the position of the gate drivers in FIG. 1B and gate drivers may be arranged at the position of the source drivers in FIG. 1B. Further alternatively, without disposing the second gate drivers 104g_2 in the folded region, a circuit may be avoided being provided at a fold in a manner similar to that of the gate divers 104g_2A and 104g_2C or the gate drivers 104g_2B and 104g_2D in FIG. 7A. Accordingly, reliability of the display panel can be improved. Further still alternatively, the gate drivers can be mounted by a COG method or a TAB method.

Figure 7B:
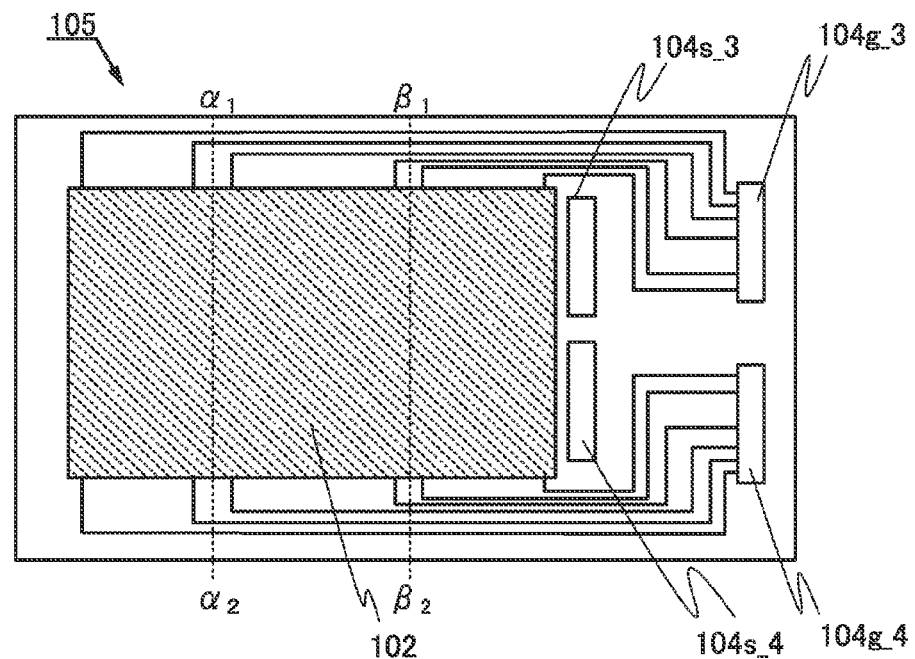

As shown in FIG. 7B, gate drivers and source drivers may be arranged on the same side. In FIG. 7B, a first gate driver 104g_3, a second gate driver 104g_4, a first source driver 104s_3, and a second source driver 104s_4 are arranged on one side. The first gate driver 104g_3 and the second gate driver 104g_4 are connected to each other through wirings which are arranged so as to surround the periphery of the display portion 102. With such a disposal, the position at which the display portion 102 is folded can be freely changed. Moreover, the driver circuits are not folded; therefore, no pressure is applied to a transistor. Accordingly, reliability of the display panel can be improved. Note that in FIG. 7B, the gate drivers are arranged on the source driver side to largely detour wirings connected to gate lines; however, one embodiment of the present invention is not limited thereto. Alternatively, source drivers may be arranged on the gate driver sides to largely detour wirings connected to source lines.

Next, the display state in which the display portion 102 of the display panel 105 in FIG. 1B is unfolded (first mode) is described with reference to FIGS. 2A and 2B.

Figure 2A:
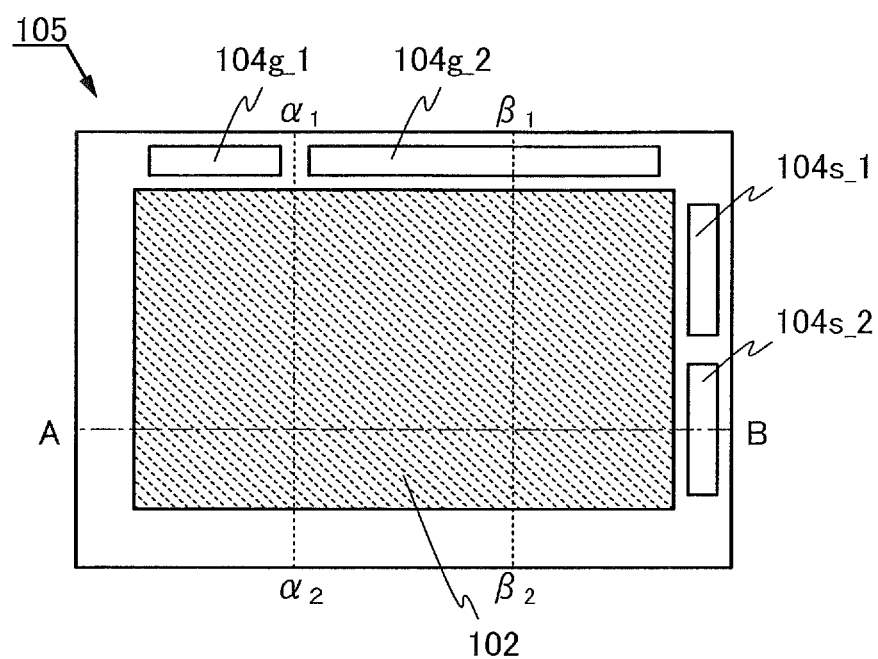
FIGS. 2A and 2B are a top schematic view and a cross-sectional view illustrating a structure of a data processing device.
Figure 2B:
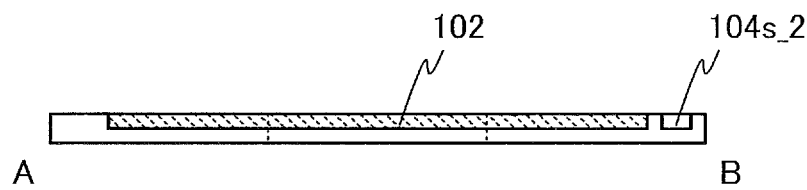

FIG. 2A is a top schematic view in the case where the display portion 102 of the display panel 105 is unfolded (first mode), and FIG. 2B is a cross-sectional view taken along dashed-dotted line A-B in FIG. 2A.

In the case of the display portion 102 in FIGS. 2A and 2B, an image can be displayed on the entire display portion 102 with the use of the first gate driver 104g_1, the second gate driver 104g_2, the first source driver 104s_1, and the second source driver 104s_2.

Next, the display state in which the display portion 102 of the display panel 105 in FIG. 1B is folded (second mode) is described with reference to FIGS. 3A to 3C.

Figure 3A:
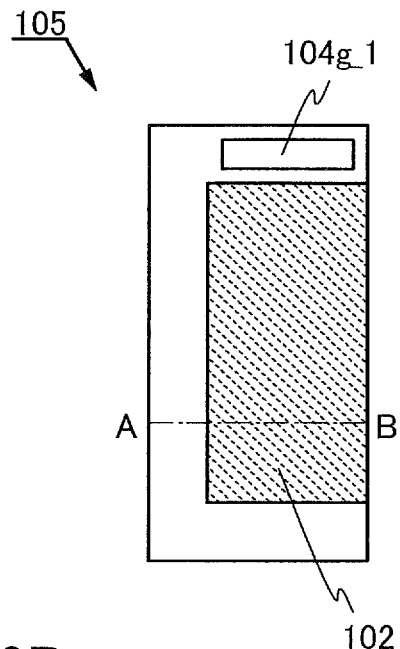
FIGS. 3A to 3C are a top schematic view and cross-sectional views illustrating a structure of a data processing device.
Figure 3B:
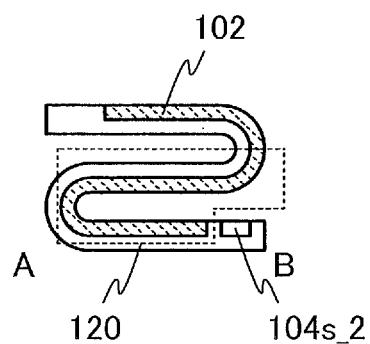

FIG. 3A is a top schematic view in the case where the display portion 102 is folded (second mode), and FIG. 3B is a cross-sectional view taken along dashed-dotted line A-B in FIG. 3A. Note that FIG. 3C is a cross-sectional view of the display panel 105 in a display state different from that in FIG. 3B.

In the case of the display portion 102 in FIG. 3A, an image can be displayed on the entire display portion 102 with the use of the first gate driver 104g_1, the second gate driver 104g_2, the first source driver 104s_1, and the second source driver 104s_2. Note that in FIG. 3B, the state in which an image is displayed on the entire display portion 102 is schematically shown. However, a region 120 positioned at a folded place cannot be directly seen by viewers. Therefore, as shown in FIG. 3C, power consumption of the display portion 102 can be reduced in such a manner that the display portion 102 is divided into a display portion 102a and a display portion 102b and only an image on the display portion 102a which can be seen by viewers are displayed and an image on the display portion 102b which cannot be seen by the viewers is not displayed.

A variety of methods can be employed not to thus display the image on the display portion 102b. For example, a black image having minimum luminance or gray scale is displayed on pixels of the display portion 102b. That is, the black image is displayed by controlling video signals supplied to the display portion 102b. Accordingly, light is not emitted from the display portion 102b, which substantially corresponds to the state in which an image is not displayed.

Furthermore, another method can also be employed. In such a case, the method differs depending on the circuit configuration of a pixel. Alternatively, the method differs depending on the place where source drivers and gate drivers are arranged.

Figure 8A:
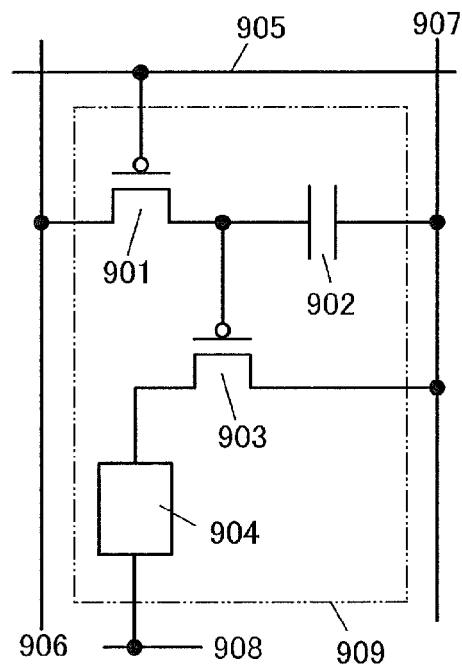
FIGS. 8A and 8B are diagrams each illustrating a circuit configuration of a pixel.
Figure 8B:
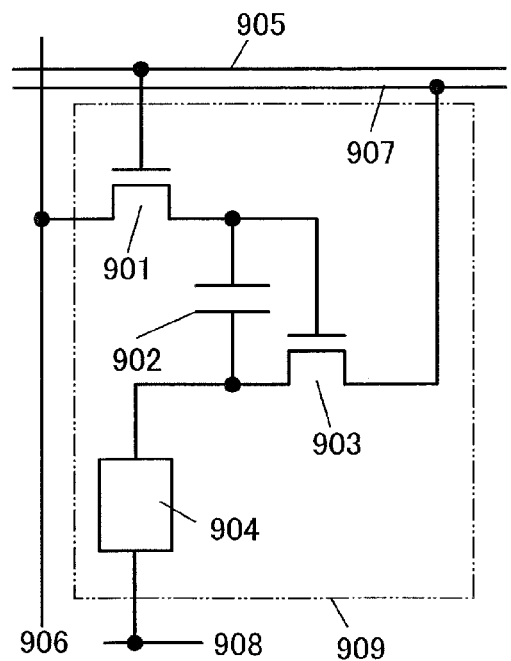

First, examples of a pixel circuit are illustrated in FIGS. 8A and 8B. Note that although a pixel including transistors, which is used for an active-matrix display device, is shown in FIGS. 8A and 8B, one embodiment of the present invention is not limited thereto. A pixel without a transistor or the like, which is used for a passive-matrix display device, may be employed. Alternatively, a lighting device in which pixels are not arranged and light is emitted from the entire surface may be employed.

A pixel 909 includes a transistor 901, a transistor 903, a capacitor 902, and a light-emitting element 904. Pixels are connected to each other through wirings 906, 905, 907, and 908.

The wiring 906 has a function capable of supplying a video signal, an initialization signal, a precharge signal, or the like. Thus, the wiring 906 has a function as a source signal line, a video signal line, or the like. The wiring 905 has a function capable of supplying a selection signal or the like. Thus, the wiring 905 has a function as a gate signal line or the like. The wiring 907 has a function of supplying current to the light-emitting element 904 or the transistor 903 or a function of supplying a signal for correcting the current of the transistor 903. Thus, the wiring 907 has a function as an anode line, a current supply line, a power supply line, a voltage supply line, or the like. The wiring 908 has a function as a cathode line, a common electrode, or the like.

The transistor 901 has a function capable of controlling whether to supply a video signal, an initialization signal, or the like or not, whether to select a pixel or not, or the like. Thus, the transistor 901 has a function as a selection transistor. The capacitor 902 has a function capable of holding a video signal, a threshold voltage of the transistor, or the like. The transistor 903 has a function capable of controlling the amount of current flowing through the light-emitting element 904. The transistor 903 can control the amount of the current in accordance with voltage held in the capacitor 902. Thus, the transistor 903 has a function as a driving transistor. Accordingly, it is preferable that the transistor 903 be a p-channel transistor in FIG. 8A and an n-channel transistor in FIG. 8B. Note that one embodiment of the present invention is not limited thereto.

Note that the pixel circuit can have a variety of configurations. Therefore, one embodiment of the present invention is not limited to the configuration in FIGS. 8A and 8B.

Figure 9A:
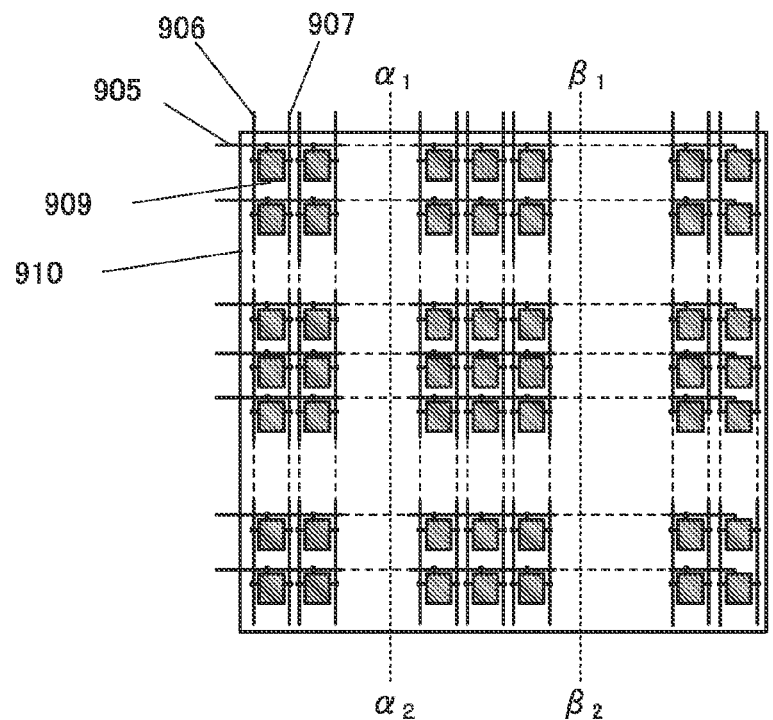
FIGS. 9A and 9B are diagrams each illustrating a circuit configuration of a display device.
Figure 9B:
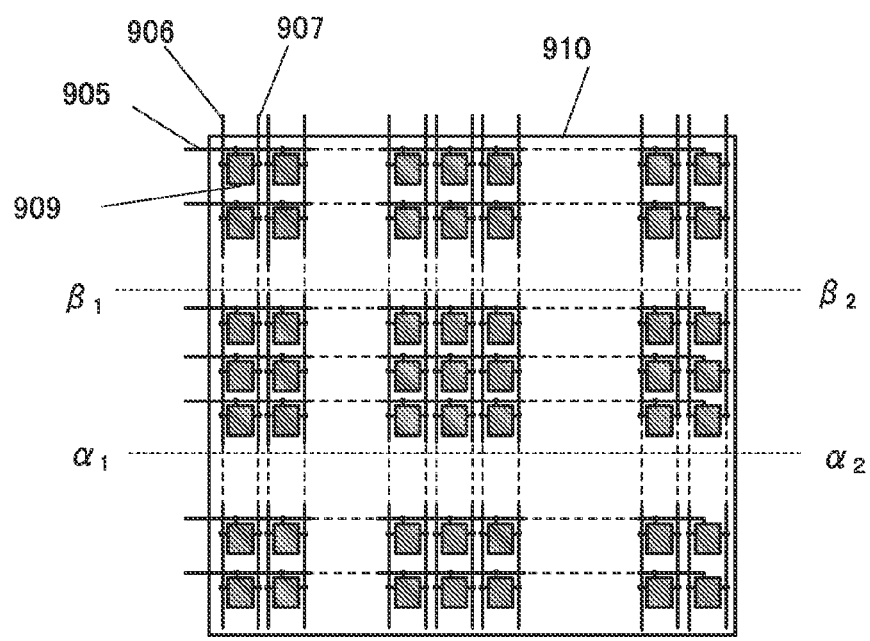

In FIGS. 9A and 9B, the pixel circuits in FIG. 8A are arranged in a matrix. FIG. 9A shows the case where folds are provided parallel to the wirings 907, and FIG. 9B shows the case where folds are provided parallel to the wirings 905.

Figure 10:
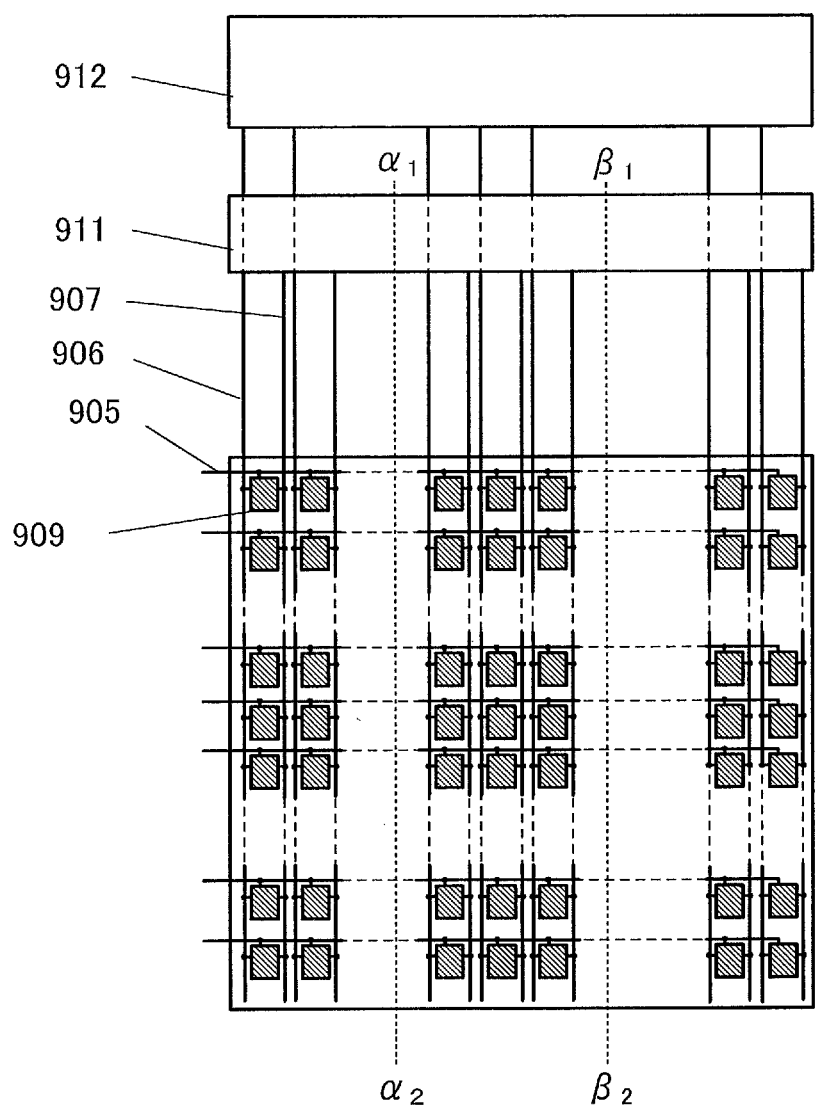
FIG. 10 is a diagram illustrating a circuit configuration of a display device.

FIG. 10 is a block diagram in the case of FIG. 9A where a circuit 911 that controls conducting states of the wirings 907 is provided. The wirings 906 are connected to a source driver circuit 912. The wirings 907 are connected to the circuit 911. To which wiring of the plurality of wirings 907 voltage is supplied and to which wiring thereof voltage is not supplied can be controlled by the circuit 911. Accordingly, a non-light-emitting region can be formed when the display panel 105 is folded; thus, power consumption can be reduced.

Figure 11A:
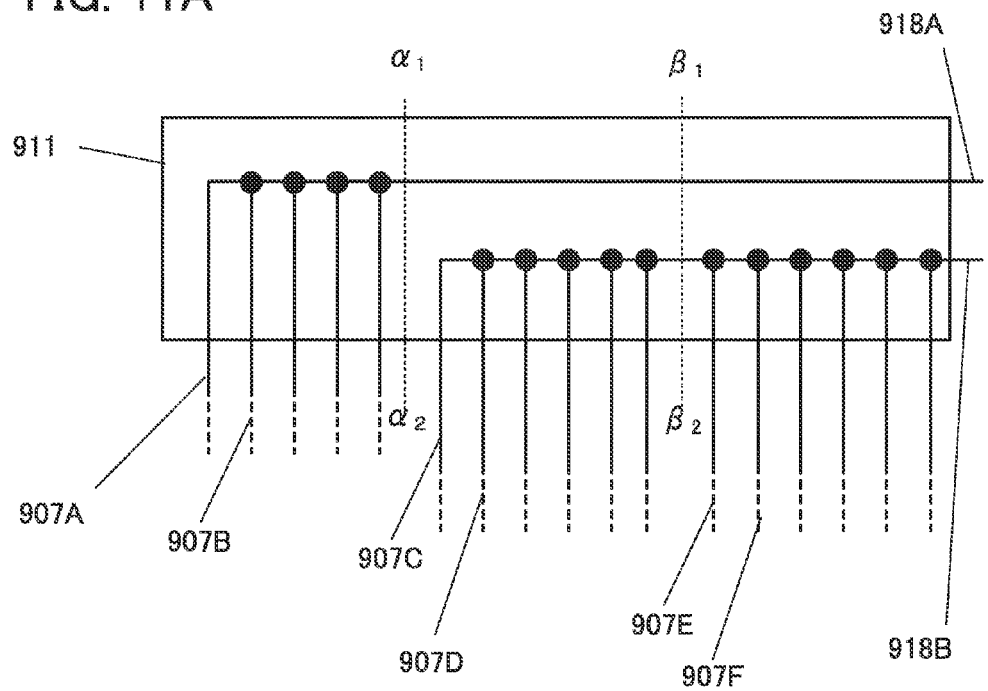
FIGS. 11A and 11B are diagrams each illustrating a circuit configuration of a display device.
Figure 11B:
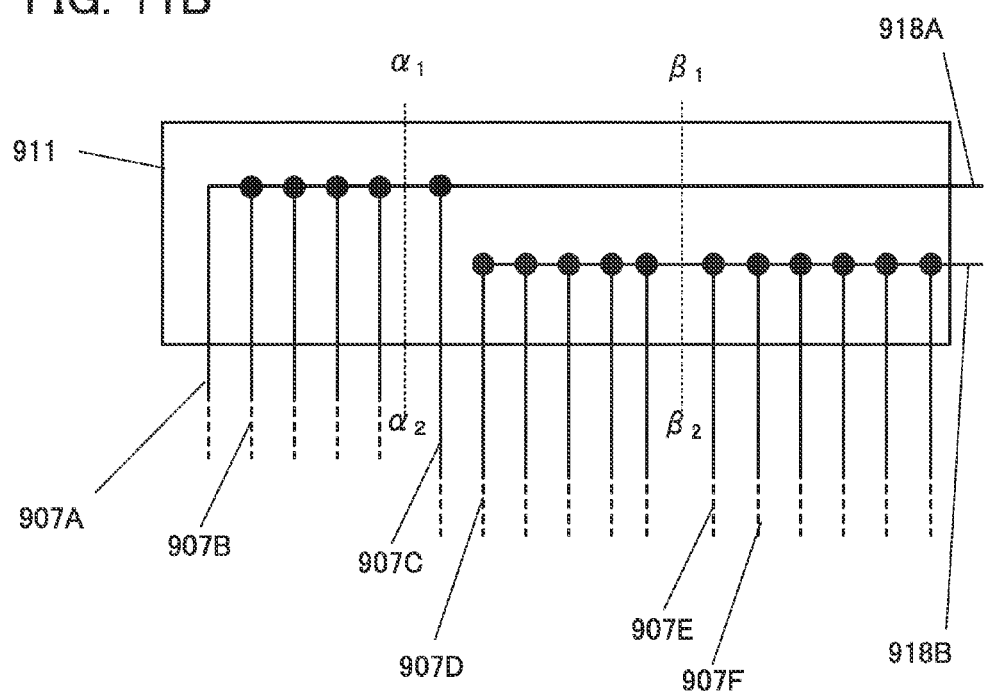

FIGS. 11A and 11B illustrate examples of the circuit configuration inside the circuit 911. In FIG. 11A, a wiring 918A and a wiring 918B are used in a left-side region and a right-side region of dashed line $\alpha_1$-$\alpha_2$ which denotes a first fold, respectively. The left-side region and the right-side region of the dashed line $\alpha_1$-$\alpha_2$ which denotes the first fold are a display region and a non-display region, respectively, when the display panel 105 is folded. Here, wirings 907A, 907B, and the like are connected to the wiring 918A, and wirings 907C, 907D, 907E, 907F, and the like are connected to the wiring 918B. With such a configuration, current is supplied to the transistor 903 and the light-emitting element 904 in each pixel through the wirings 907A, 907B, and the like by supply of voltage to the wiring 918A when the display panel 105 is folded. Accordingly, light emission can be obtained. In contrast, current is not supplied to the transistor 903 and the light-emitting element 904 in each pixel in such a manner that voltage is not supplied to the wiring 918B, which becomes a floating state, or a voltage is supplied such that the light-emitting element 904 does not emit light.

Note that although, in FIG. 11A, the transistor 903 and the light-emitting element 904 in each pixel are separately connected to the wiring 918A and the wiring 918B at the boundary of the dashed line $\alpha_1$-$\alpha_2$ which denotes the first fold, one embodiment of the present invention is not limited thereto. As shown in FIG. 11B, the transistor 903 and the light-emitting element 904 may be connected to the wiring 918A so that also the right-side region of the dashed line $\alpha_1$-$\alpha_2$ which denotes the first fold emits light when the display panel 105 is folded.

Note that the source driver circuit 912 and the circuit 911 may be divided into a plurality of IC chips so that they can be mounted by a COG method or a TAB method in such a manner that the IC chips are not arranged in a region overlapping with the folds.

Figure 12A:
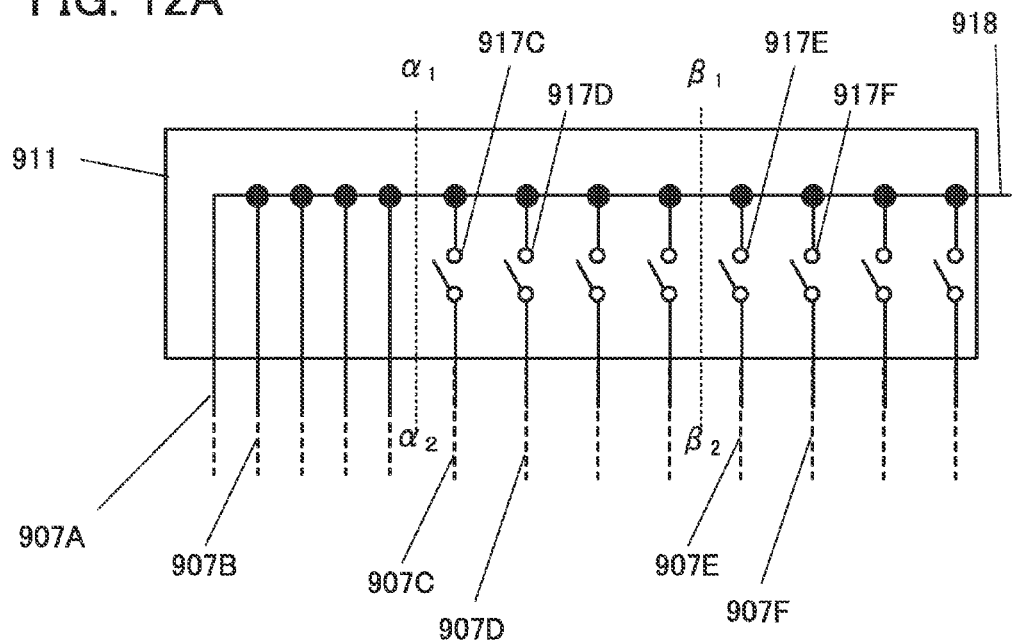
FIGS. 12A and 12B are diagrams each illustrating a circuit configuration of a display device.

Note that although, in FIGS. 11A and 11B, a light-emitting region and a non-light-emitting region when the display panel 105 is folded can be controlled with the wiring 918A and the wiring 918B, respectively, one embodiment of the present invention is not limited thereto. Light emission may be controlled by combining the wiring 918A and the wiring 918B into one wiring and arranging switches. In FIG. 12A, the wirings 907A, 907B, and the like in the left-side region of the dashed line $\alpha_1$-$\alpha_2$ which denotes the first fold are connected to the wiring 918 without through a switch. Therefore, light can be emitted regardless of whether the display panel 105 is folded or not. In contrast, the wirings 907C, 907D, 907E, 907F, and the like in the right-side region of the dashed line $\alpha_1$-$\alpha_2$ which denotes the first fold are connected to the wiring 918 through switches 917C, 917D, 917E, 917F, and the like, respectively. Therefore, the pixels in the right-side region thereof can be controlled to emit no light by turning off these switches when the display panel 105 is folded.

Figure 12B:
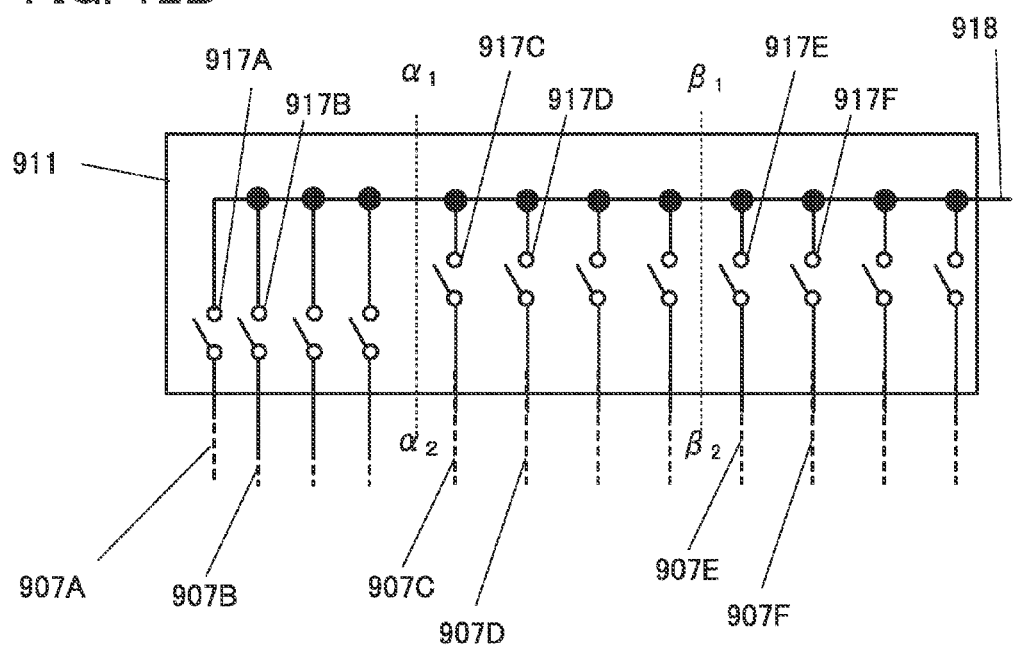

Note that in the case where a resistance value changes in some regions due to whether switches are provided or not, the wirings 907A, 907B, and the like in the left-side region of the dashed line $\alpha_1$-$\alpha_2$ which denotes the first fold may be connected to the wiring 918 through switches 917A, 917B, and the like as shown in FIG. 12B.

Figure 13A:
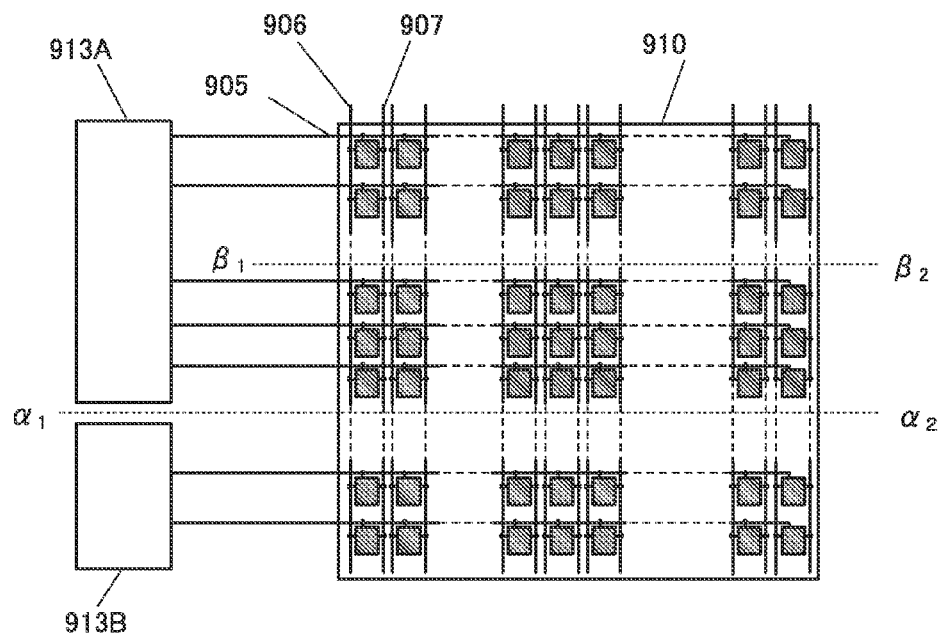
FIGS. 13A and 13B are diagrams each illustrating a circuit configuration of a display device.

Next, in the case of FIG. 9B, a circuit configuration in which light emission can be controlled in some regions is shown in FIG. 13A. As shown in FIG. 13A, a gate driver 913B is connected to the transistor 903 and the light-emitting element 904 in each pixel in a lower region of dashed line $\alpha_1$-$\alpha_2$ which denotes a first fold, whereas a gate driver 913A is connected to the transistor 903 and the light-emitting element 904 in each pixel in an upper region of the dashed line $\alpha_1$-$\alpha_2$ which denotes the first fold. In the lower region of the dashed line $\alpha_1$-$\alpha_2$ which denotes the first fold, the gate driver 913B operates so that light is emitted even when the display panel 105 is folded, whereas in the upper region thereof, the gate driver 913A operates so as not to select a pixel so that light is not emitted when the display panel 105 is folded. For example, the gate driver 913A outputs an L signal, whereby the gate driver 913A does not substantially carry out scan operation. Accordingly, power consumption can be reduced. Note that FIG. 3C corresponds to the case of FIG. 13A.

Figure 3C:
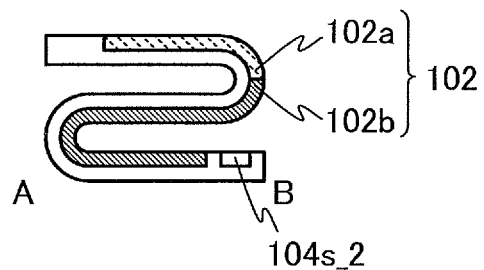

In the case of the display portion 102 shown in FIG. 3C, only the display portion 102a can be displayed in such a manner that, for example, the first gate driver 104g_1, the first source driver 104s_1, and the second source driver 104s_2 are used and a selection signal is not output (e.g., only an L signal is output) from the second gate driver 104g_2 so as not to substantially carry out scan operation.

Figure 13B:
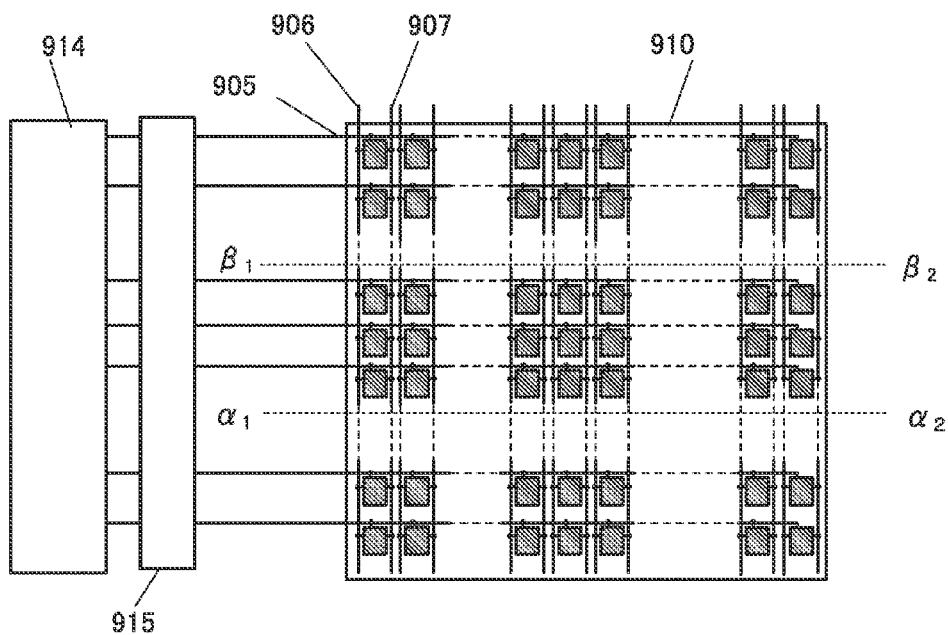
Figure 14:
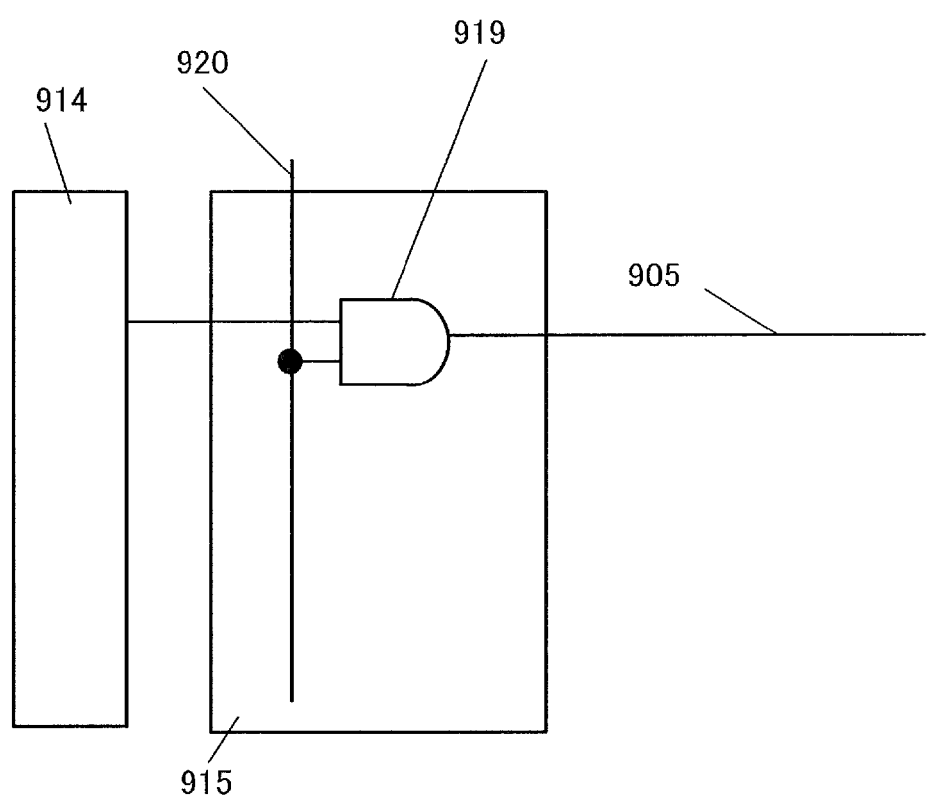
FIG. 14 is a diagram illustrating a circuit configuration of a display device.

Note that as shown in FIG. 13B, whether a selection signal is output or not may be controlled by providing a circuit 915 in an output portion of a gate driver 914. FIG. 14 illustrates an example of the circuit 915. An output of the gate driver 914 is controlled by an AND circuit 919 by setting the potential of a wiring 920 to an H signal and thus output to the wiring 905. On the other hand, an L signal is always supplied to the wiring 905 by setting the potential of the wiring 920 to an L signal. Accordingly, supply of a selection signal to a pixel can be stopped; thus, power consumption can be reduced.

Note that the gate driver 914, the circuit 915, the gate driver 913A, and the like may be divided into a plurality of IC chips so that they can be mounted by a COG method or a TAB method in such a manner that the IC chips are not arranged in a region overlapping with the folds.

Figure 15A:
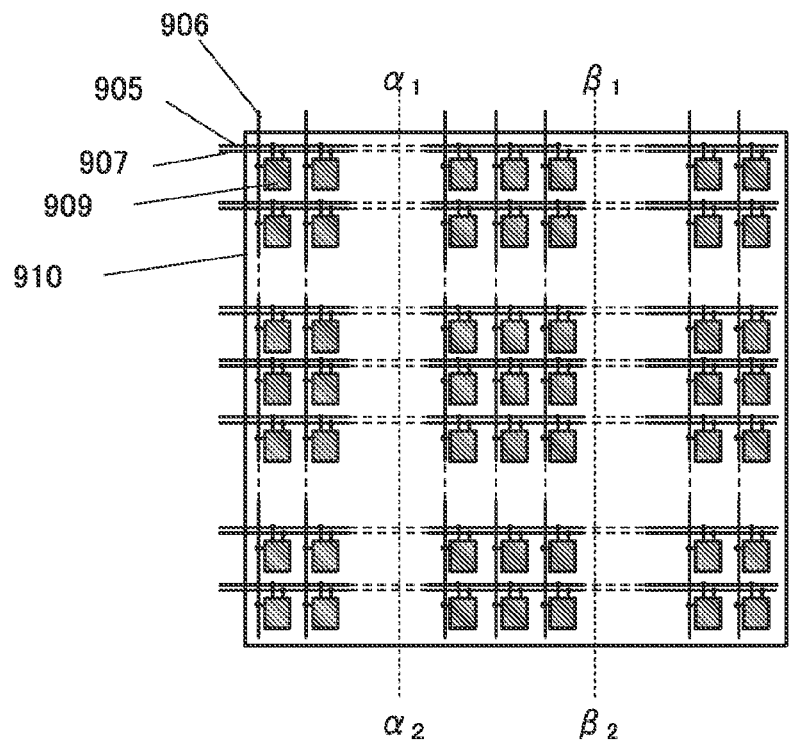
FIGS. 15A and 15B are diagrams each illustrating a circuit configuration of a display device.
Figure 15B:
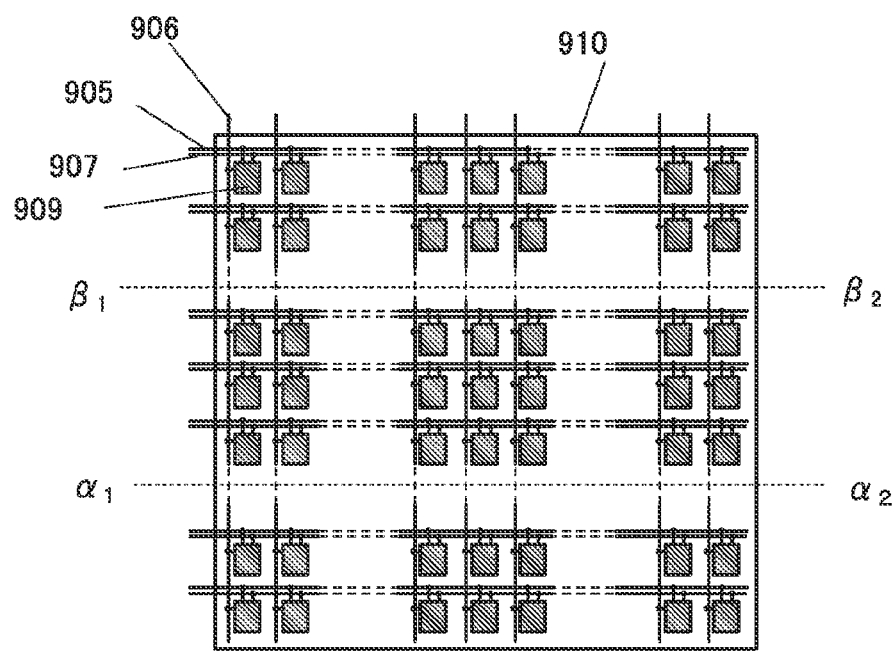

Next, in FIGS. 15A and 15B, the pixel circuits in FIG. 8B are arranged in a matrix. FIG. 15A shows the case where folds are provided parallel to the wirings 906, and FIG. 15B shows the case where folds are provided parallel to the wirings 905.

Figure 16A:
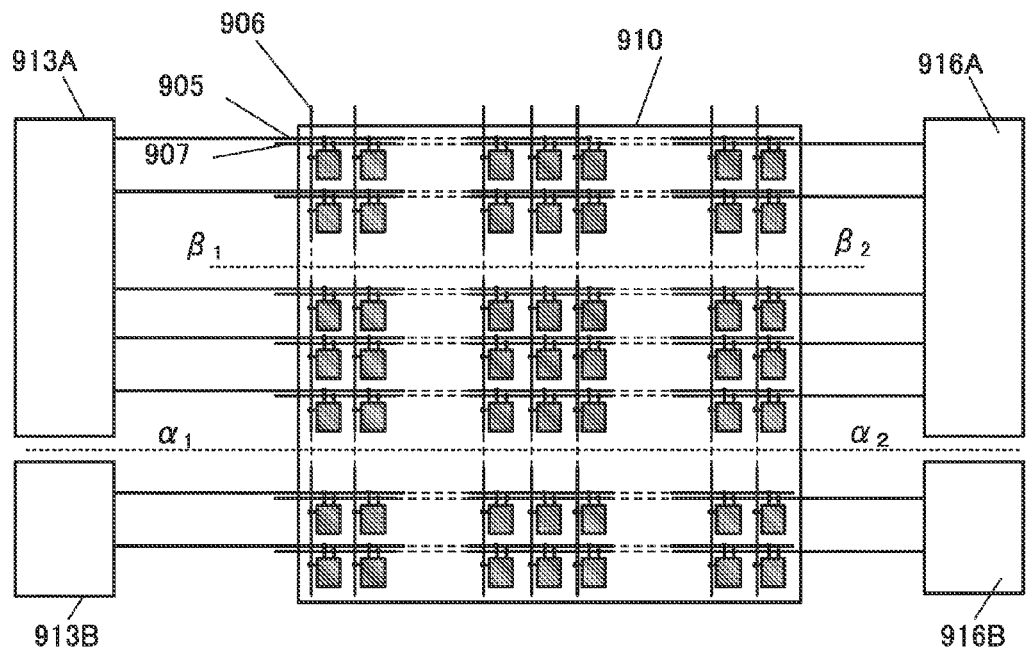
FIGS. 16A and 16B are diagrams each illustrating a circuit configuration of a display device.
Figure 16B:
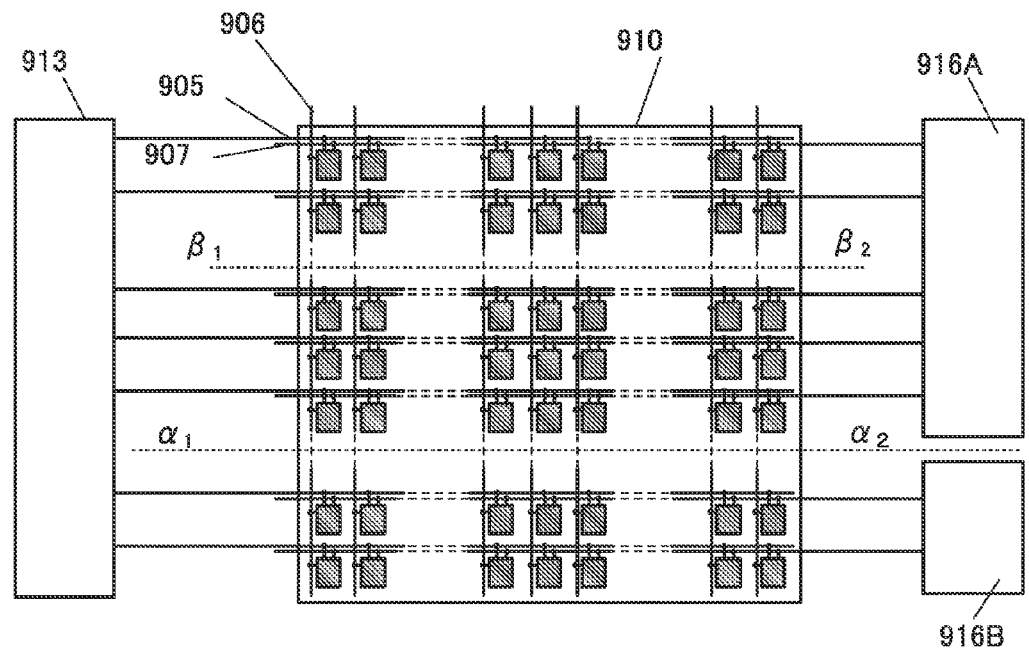

In FIGS. 16A and 16B as well as in FIG. 13A, different driver circuits are arranged in accordance with regions. Note that there are a case where a circuit for driving the wiring 905 is provided and a case where a circuit for driving the wiring 907 is provided. In FIG. 16A, a circuit 916A and a circuit 916B are provided as the circuits for driving the wiring 907. In contrast, in FIG. 16B, a circuit 913 for driving the wiring 905 is provided without being divided in accordance with regions. In other words, the circuit for driving the wiring 905 and the circuit for driving the wiring 907 can be divided or not every region.

Figure 17A:
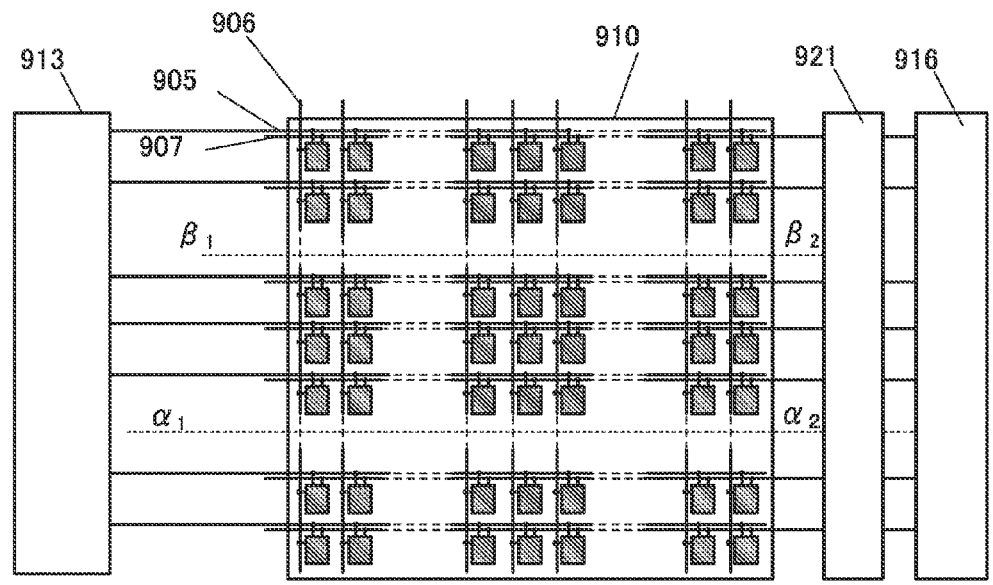
FIGS. 17A and 17B are diagrams illustrating a circuit configuration of a display device.
Figure 17B:
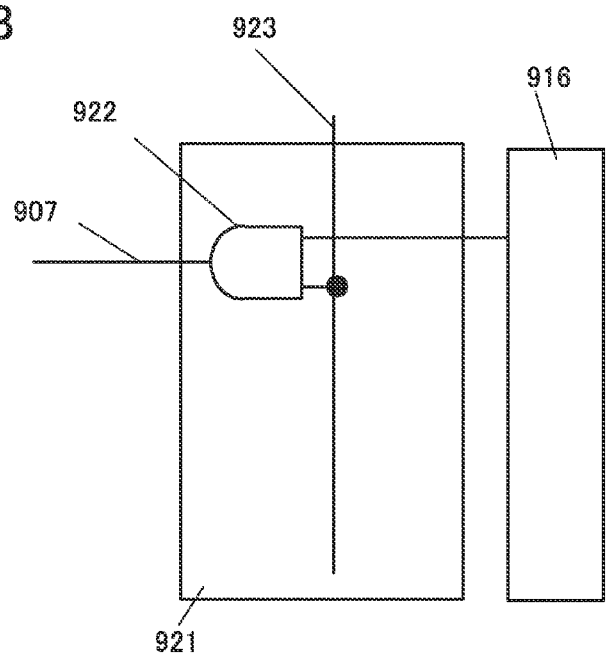

FIG. 17A illustrates an example where a circuit 921 is provided in an output portion of a circuit 916 in a manner similar to that of the circuit 915 in FIG. 13B. FIG. 17B illustrates a specific example of the circuit 921. The potential of the wiring 907 is controlled by an AND circuit 922 by controlling the potential of a wiring 923.

In this manner, a light-emitting state can be controlled in accordance with regions by a variety of methods.

However, when the driver circuit portion 104 is driven in a structure where an image is displayed only in the display portion 102a as in the display portion 102 in FIG. 3C and then an image is displayed in the entire display portion 102 in a state where the display portion 102 of the display panel 105 in FIGS. 2A and 2B is unfolded (first mode), a phenomenon arises in which the display portion 102a and the display portion 102b shown in FIG. 3C are different from each other in luminance.

For example, with a structure in which an image is displayed only in the display portion 102a in the case where a light-emitting element is used in the display portion 102, the light-emitting element in the display portion 102a might deteriorate. Therefore, in the first mode in which the display portion 102 is unfolded, luminance or the like varies in the plane of the display portion 102 and such variation is recognized as display unevenness.

Thus, in the data processing device 100 of one embodiment of the present invention, display unevenness of the display portion 102 can be inhibited in such a manner that a program carries out low power consumption processing and degradation correction processing in accordance with the first mode in which the display portion 102 is unfolded or the second mode in which the display portion 102 is folded to control a driving method. Therefore, a data processing device having high display quality can be provided.

Here, the above program is described with reference to FIG. 4 and FIGS. 5A and 5B.

<Program>

Figure 4:
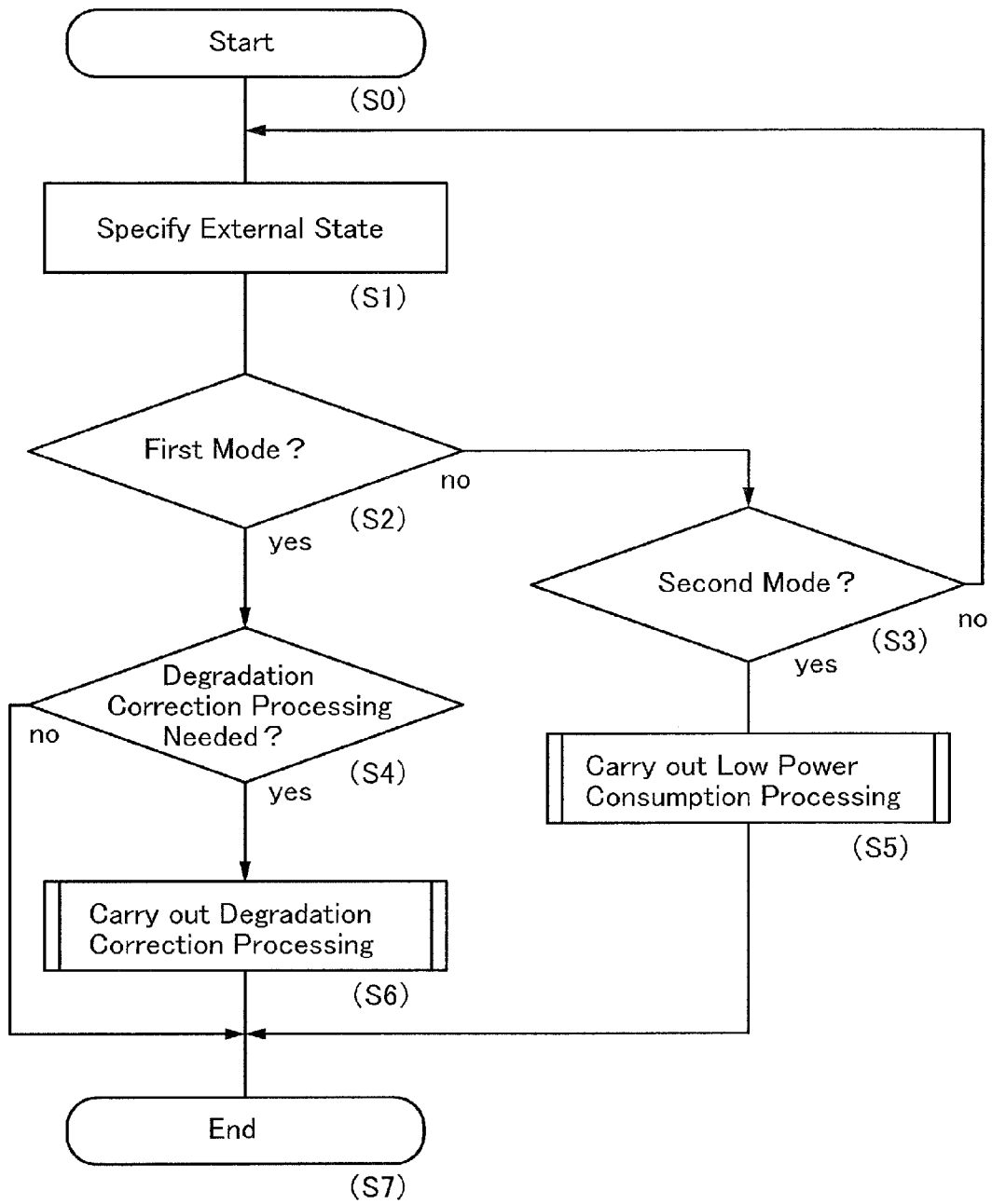
FIG. 4 is a flow chart showing a program executed by an arithmetic portion of a data processing device.

FIG. 4 is a flow chart of a program of the memory portion 110 included in the data processing device 100 in FIG. 1A.

First, in a first step, the external state of the display portion 102 is specified by data from the sensor portion 106 (Step S1).

In a second step, whether the display portion 102 is in the unfolded mode (first mode) or not is judged (Step S2). The program proceeds to a fourth step in the case of the first mode or a third step in the case of a mode other than the first mode.

In the third step, whether the display portion 102 is in the folded mode (second mode) or not is judged (Step S3). The program proceeds to a fifth step in the case of the second mode or the first step in the case of a mode other than the second mode.

In the fourth step, whether degradation correction processing is necessary or not is judged (Step S4). The program proceeds to a sixth step in the case where the degradation correction processing is necessary or a seventh step in the case where the degradation correction processing is not necessary.

In the fifth step, low power consumption processing is carried out (Step S5). Moreover, the program proceeds to the seventh step after the fifth step is terminated.

In the sixth step, the degradation correction processing is carried out (Step S6).

In the seventh step, the program is terminated (Step S7).

Figure 5A:
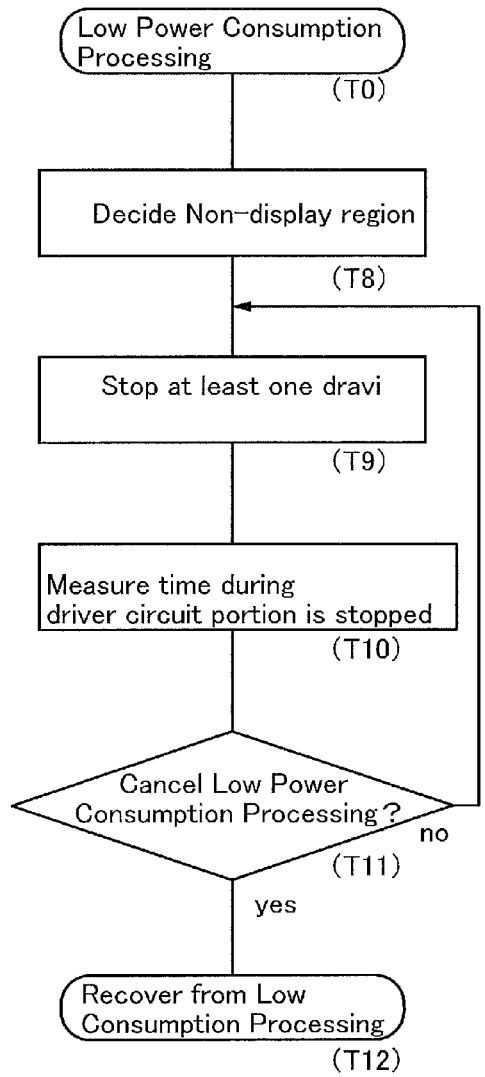
FIGS. 5A and 5B are flow charts each showing a program executed by an arithmetic portion of a data processing device.
Figure 5B:
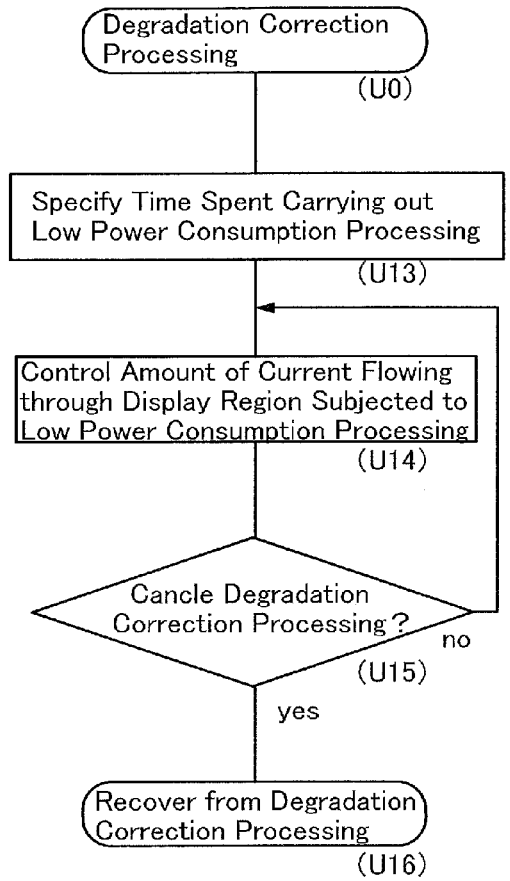

Here, as for the low power consumption processing in the fifth step (Step S5) and the degradation correction processing in the sixth step (Step S6), the description is made with reference to flow charts shown in FIGS. 5A and 5B.

<Low Power Consumption Processing>

In an eighth step, a non-display region is decided (Step T8). The non-display region may be a region which is not seen by viewers like the region 120 in FIG. 3B.

In a ninth step, at least one driver circuit portion is stopped (Step T9).

In the mode in which the display portion 102 is folded (second mode), an image in a region which is not seen by viewers can be made not to be displayed by stopping at least one driver circuit portion; thus, a data processing device 100 having low power consumption can be obtained.

In a tenth step, the time during which at least one driver circuit portion is stopped is measured (Step T10).

In an eleventh step, whether the low power consumption processing is canceled or not is judged (Step T11). The program proceeds to a twelfth step in the case where the low power consumption processing is canceled or the ninth step in the case where the low power consumption processing is not canceled.

The twelfth step recovers from the low power consumption processing to the program (Step T12).

<Degradation Correction Processing>

In a thirteenth step, the time of the display region subjected to the low power consumption processing is specified (Step U13).

In a fourteenth step, the amount of current flowing through the display region subjected to the low power consumption processing is controlled (Step U14).

As a method for controlling the amount of current, for example, in the case where a light-emitting element is used in the display portion 102, the amount of current flowing through a non-display region in the mode in which the display portion 102 is folded (second mode) is decreased or the amount of current flowing through a display region in the mode in which the display portion 102 is folded (second mode) is increased.

Display unevenness in the mode in which the display portion 102 is unfolded (first mode) can be inhibited by thus controlling the amount of current flowing through the display region or the non-display region in the mode in which the display portion 102 is folded (second mode).

In a fifteenth step, whether the degradation correction processing is canceled or not is judged (Step U15). The program proceeds to a sixteenth step in the case where the degradation correction processing is canceled or the fourteenth step in the case where the degradation correction processing is not canceled.

Moreover, in the degradation correction processing, the amount of current flowing through the display region subjected to the low power consumption processing is calculated from the time of the low power consumption processing and controlled. However, degradation degree with respect to time might differ depending on a display state; therefore, the value of the amount of current flowing through the display region arbitrarily subjected to the low power consumption processing can be adjusted. For example, a coefficient of the calculation formula used for calculating the amount of the current can be changed.

The sixteenth step recovers from the degradation correction processing to the program (Step U16).

Here, an example of the structure of the driver circuit portion that carries out the above low power consumption processing and degradation correction processing is described with reference to FIG. 1B and FIGS. 6A and 6B.

Figure 6A:
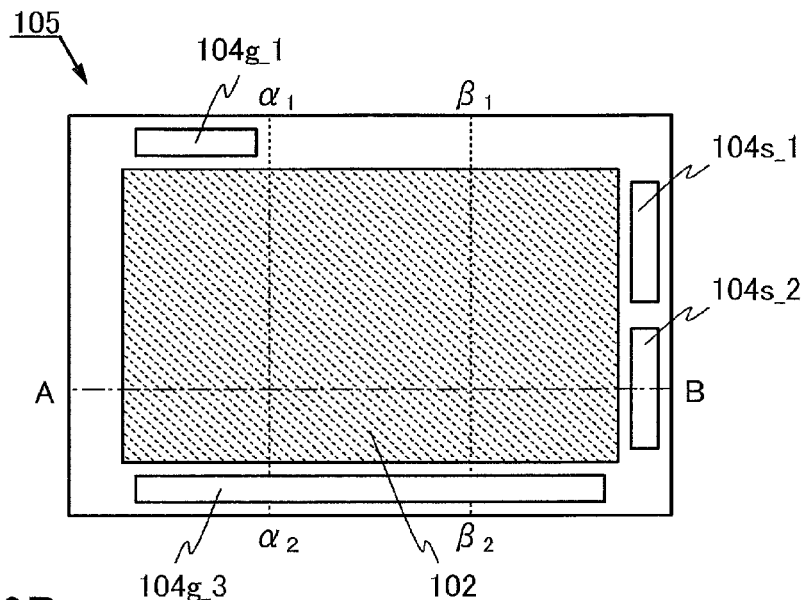
FIGS. 6A and 6B are top schematic views each illustrating a structure of a data processing device.
Figure 6B:
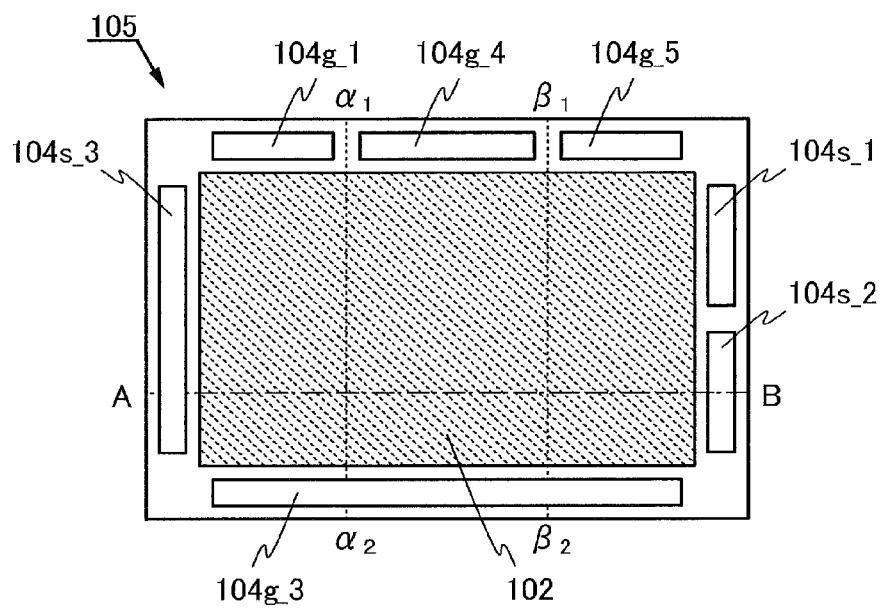

FIGS. 6A and 6B are each a top schematic view illustrating a structure of the display panel 105. Note that the display panels 105 in FIGS. 6A and 6B are modification examples of the top schematic view of the display panel 105 in FIG. 1B.

The display panel 105 in FIGS. 6A and 6B as well as the display panel 105 in FIG. 1B can be folded along dashed lines $\alpha_1$-$\alpha_2$ and $\beta_1$-$\beta_2$.

The display panel 105 in FIG. 6A includes the display portion 102 and the driver circuit portion 104 in the periphery of the display portion 102. The driver circuit portion 104 includes the first gate driver 104g_1, a third gate driver 104g_3, the first source driver 104s_1, and the second source driver 104s_2. Note that the first gate driver 104g_1, the first source driver 104s_1, and the second source driver 104s_2 are independently formed in unfolded regions.

The display panel 105 in FIG. 6B includes the display portion 102 and the driver circuit portion 104 in the periphery of the display portion 102. The driver circuit portion 104 includes the first gate driver 104g_1, the third gate driver 104g_3, a fourth gate driver 104g_4, a fifth gate driver 104g_5, the first source driver 104s_1, the second source driver 104s_2, and a third source driver 104s_3. Note that the first gate driver 104g_1, the fourth gate driver 104g_4, the fifth gate driver 104g_5, the first source driver 104s_1, the second source driver 104s_2, and the third source driver 104s_3 are independently formed in unfolded regions.

As shown in FIG. 1B and FIGS. 6A and 6B, it is preferable that at least one driver of the driver circuit portion 104 be independently formed in an unfolded region. Moreover, it is preferable that the drivers of the driver circuit portion be able to be independently controlled.

The low power consumption processing and the degradation correction processing can be preferably carried out in such a manner that the drivers of the driver circuit portion are thus formed independently of each other in unfolded regions and are independently controlled.

Moreover, resistance to folding of the driver circuit portion is preferably improved by independently forming the drivers of each other in unfolded regions. For example, in the case where the driver is formed in a folded region, the driver might be broken by alternately repeating the first mode in which the display portion 102 is unfolded and the second mode in which the display portion 102 is folded. This is because more elements such as transistors exist in the driver circuit portion than in the display portion 102.

Furthermore, as shown in FIGS. 6A and 6B, it is preferable to form a plurality of driver circuit portions in a folded region and an unfolded region. With the structure in FIGS. 6A and 6B, different driver circuit portions can be used in the first mode in which the display portion 102 is unfolded and the second mode in which the display portion 102 is folded. Even in the case where part of the driver circuit portion is broken, the driver circuit portion which is not broken can be used to compensate the operation of the display portion 102 when the plurality of driver circuit portions is formed.

This embodiment can be combined as appropriate with any of the other embodiments in this specification.

[Embodiment 2]

In this embodiment, an example of a data processing device of one embodiment of the present invention will be described with reference to FIGS. 18A to 18C.

Figure 18A:
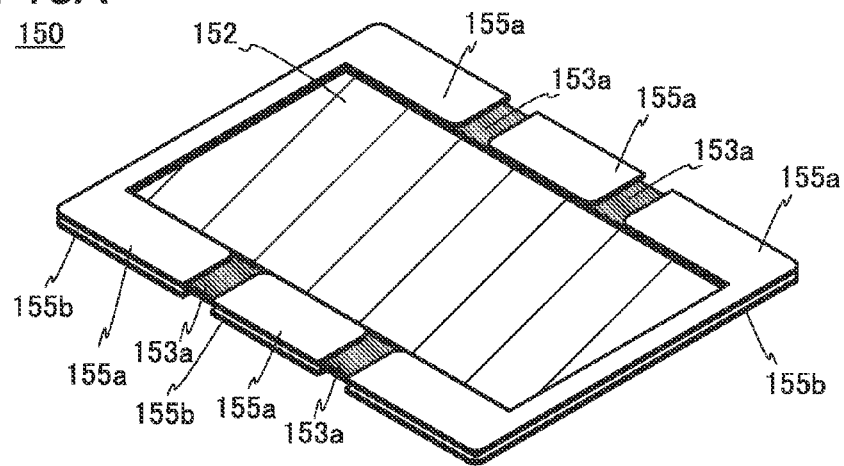
FIGS. 18A to 18C are perspective views illustrating one embodiment of a data processing device.

FIG. 18A illustrates a data processing device 150 in a mode in which a display portion is unfolded (a first mode). FIG. 18B illustrates the data processing device 150 in the middle of changing from either the mode in which the display portion is unfolded (first mode) or a mode in which the display portion is folded (a second mode) to the other mode. FIG. 18C illustrates the data processing device 150 in the mode in which the display portion is folded (second mode).

Figure 18B:
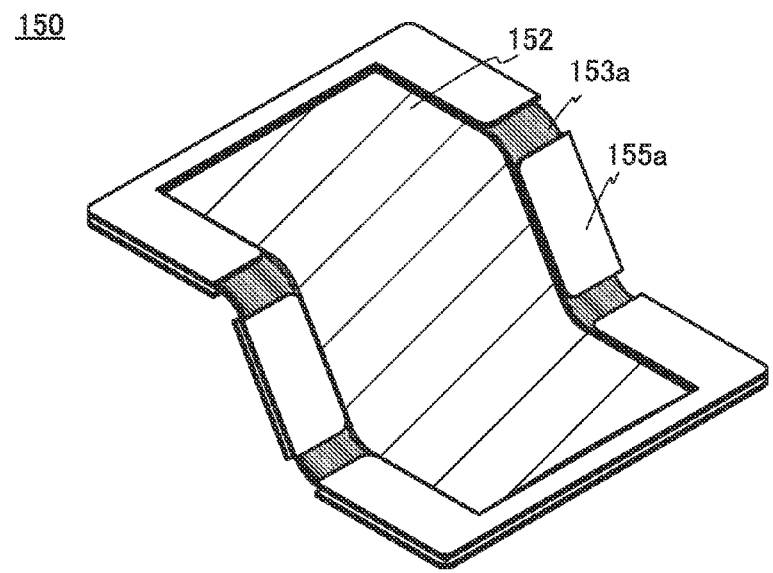
Figure 18C:
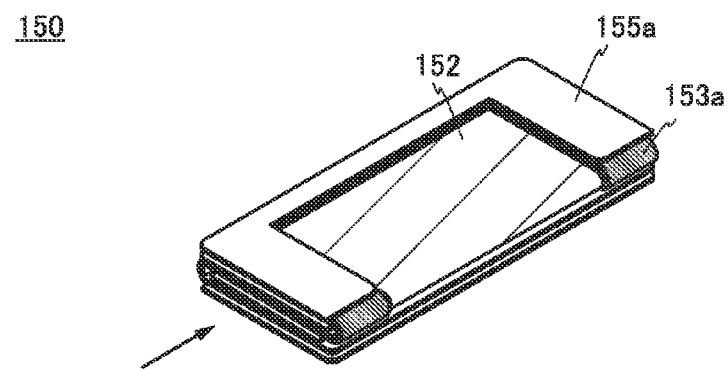

The data processing device 150 in FIGS. 18A to 18C includes a display panel 152 including a display portion having flexibility. The data processing device 150 further includes a plurality of support panels 153a, a plurality of support panels 155a, and a plurality of support panels 155b.

The support panel 153a is formed with, for example, a material having lower flexibility than a material of the display panel 152, and the support panels 155a and 155b are each formed with, for example, a material having lower flexibility than a material of the support panel 153a. As illustrated in FIGS. 18A to 18C, when the support panels are arranged in the periphery of the display panel 152 and on the surface opposite to the display portion of the display panel 152, the display panel 152 has high mechanical strength and is less likely to be broken.

Moreover, when the support panels 153a, 155a, and 155b are preferably formed with a material having a light-blocking property, irradiation of driver circuit portions of the display panel 152 with external light can be suppressed. Accordingly, light deterioration of transistors and the like used in the driver circuit portions can be suppressed.

Although not illustrated in FIGS. 18A to 18C, an arithmetic portion, a memory portion, a sensor portion, and the like of the data processing device 150 can be arranged between the display panel 152 and the support panels 155b.

The support panels 153a, 155a, and 155b can be formed using plastic, a metal, an alloy, rubber, or the like as a material. Plastic, rubber, or the like is preferably used because it can form a support panel that is lightweight and less likely to be broken. For example, silicone rubber, stainless steel, or aluminum may be used as the support panels 153a, 155a, and 155b.

Furthermore, the display panel 152 including the display portion having flexibility in the data processing device 150 can be folded either inward or outward. When the data processing device 150 is not used, the display panel 152 is folded to have the display portion facing inside, whereby scratches and stains on the display portion can be suppressed.

This embodiment can be combined as appropriate with any of the other embodiments in this specification.

[Embodiment 3]

In this embodiment, a light-emitting panel that can be used in the data processing device of one embodiment of the present invention will be described with reference to FIGS. 19A and 19B, FIGS. 20A and 20B, FIGS. 21A and 21B, FIGS. 22A and 22B, FIGS. 23A to 23C, and FIGS. 24A to 24C.

<Specific Example 1>

Figure 19A:
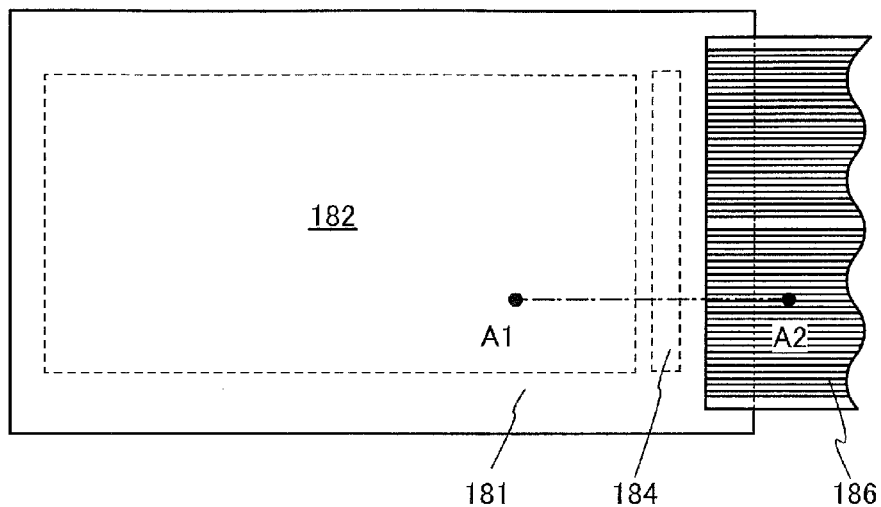
FIGS. 19A and 19B are a top view and a cross-sectional view illustrating a light-emitting panel that can be used in a data processing device.
Figure 19B:
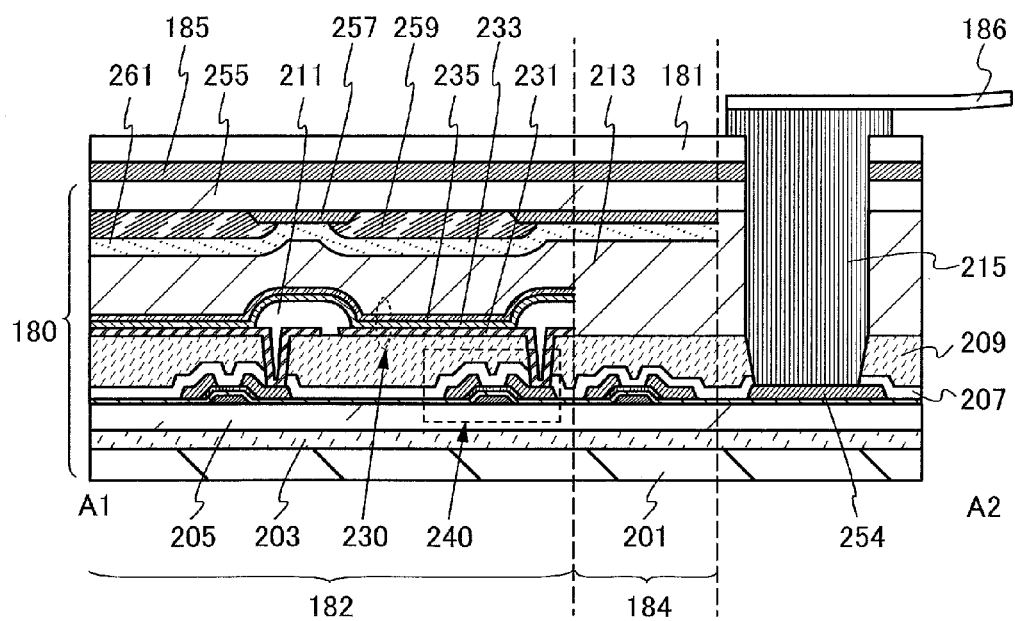

FIG. 19A is a top view of a light-emitting panel, and FIG. 19B is an example of a cross-sectional view taken along dashed-dotted line A1-A2 in FIG. 19A.

The light-emitting panel illustrated in FIG. 19B includes an element layer 180, a bonding layer 185, and a substrate 181. The element layer 180 includes a substrate 201, a bonding layer 203, an insulating layer 205, a plurality of transistors, a conductive layer 254, an insulating layer 207, an insulating layer 209, a plurality of light-emitting elements, an insulating layer 211, a sealing layer 213, an insulating layer 261, a coloring layer 259, a light-blocking layer 257, and an insulating layer 255.

The conductive layer 254 is electrically connected to an FPC 186 via a connector 215.

A light-emitting element 230 includes a lower electrode 231, an EL layer 233, and an upper electrode 235. The lower electrode 231 is electrically connected to a source electrode or a drain electrode of a transistor 240. An end portion of the lower electrode 231 is covered with the insulating layer 211. The light-emitting element 230 has a top emission structure. The upper electrode 235 has a light-transmitting property and transmits light emitted from the EL layer 233.

The coloring layer 259 is provided to overlap with the light-emitting element 230, and the light-blocking layer 257 is provided to overlap with the insulating layer 211. The coloring layer 259 and the light-blocking layer 257 are covered with the insulating layer 261. The space between the light-emitting element 230 and the insulating layer 261 is filled with the sealing layer 213.

The light-emitting panel includes a plurality of transistors in a light extraction portion 182 and a driver circuit portion 184. The transistor 240 is provided over the insulating layer 205. The insulating layer 205 and the substrate 201 are attached to each other with the bonding layer 203. The insulating layer 255 and the substrate 181 are attached to each other with the bonding layer 185. It is preferable to use films with low water permeability for the insulating layer 205 and the insulating layer 255, in which case an impurity such as water can be prevented from entering the light-emitting element 230 or the transistor 240, leading to improved reliability of the light-emitting panel. The bonding layer 203 can be formed using a material similar to that of the bonding layer 185.

The light-emitting panel in Specific Example 1 can be manufactured in the following manner: the insulating layer 205, the transistor 240, and the light-emitting element 230 are formed over a formation substrate with high heat resistance; the formation substrate is separated; and the insulating layer 205, the transistor 240, and the light-emitting element 230 are transferred to the substrate 201 and attached thereto with the bonding layer 203. The light-emitting panel in Specific Example 1 can be manufactured in the following manner: the insulating layer 255, the coloring layer 259, and the light-blocking layer 257 are formed over a formation substrate with high heat resistance; the formation substrate is separated and the insulating layer 255, the coloring layer 259, and the light-blocking layer 257 are transferred to the substrate 181 and attached thereto with the bonding layer 185.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate with high heat resistance; thus, a highly reliable transistor and an insulating film with sufficiently low water permeability can be formed. Then, the transistor and the insulating film are transferred to the substrate 181 and the substrate 201, whereby a highly reliable light-emitting panel can be manufactured. Thus, with one embodiment of the present invention, a thin or/and lightweight data processing device with high reliability can be provided.

The substrate 181 and the substrate 201 are each preferably formed using a material with high toughness. In that case, a display device with high impact resistance that is less likely to be broken can be provided. For example, when the substrate 181 is an organic resin substrate and the substrate 201 is a substrate formed using a thin metal material or a thin alloy material, the light-emitting panel can be more lightweight and less likely to be broken as compared to the case where a glass substrate is used.

A metal material and an alloy material, which have high thermal conductivity, are preferable because they can easily conduct heat to the whole substrate and accordingly can prevent a local temperature rise in the light-emitting panel. The thickness of a substrate using a metal material or an alloy material is preferably greater than or equal to 10 μm and less than or equal to 200 μm, further preferably greater than or equal to 20 μm and less than or equal to 50 μm.

Furthermore, when a material with high thermal emissivity is used for the substrate 201, the surface temperature of the light-emitting panel can be prevented from rising, leading to prevention of breakage or a decrease in reliability of the light-emitting panel. For example, the substrate 201 may have a stacked-layer structure of a metal substrate and a layer with high thermal emissivity (e.g., the layer can be formed using a metal oxide or a ceramic material).

<Specific Example 2>

Figure 20A:
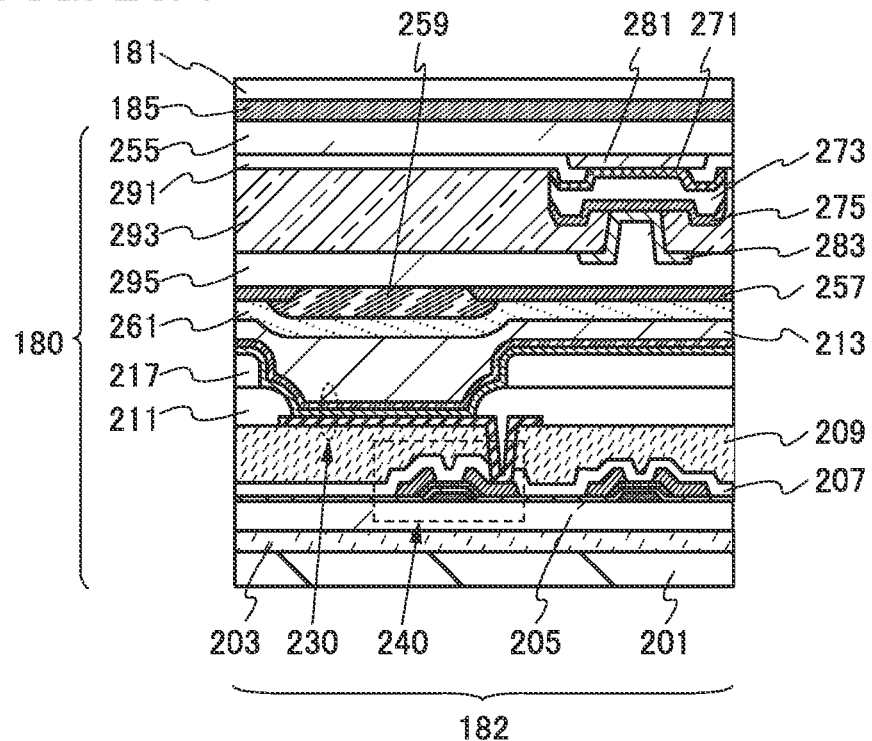
FIGS. 20A and 20B are cross-sectional views each illustrating a light-emitting panel that can be used in a data processing device.

FIG. 20A illustrates another example of the light extraction portion 182 in the light-emitting panel. The light-emitting panel in FIG. 20A is capable of touch operation. In the following specific examples, description of components similar to those in Specific Example 1 is omitted.

The light-emitting panel illustrated in FIG. 20A includes the element layer 180, the bonding layer 185, and the substrate 181. The element layer 180 includes the substrate 201, the bonding layer 203, the insulating layer 205, the plurality of transistors, the insulating layer 207, the insulating layer 209, a plurality of light-emitting elements, the insulating layer 211, an insulating layer 217, the sealing layer 213, the insulating layer 261, the coloring layer 259, the light-blocking layer 257, a plurality of light-receiving elements, a conductive layer 281, a conductive layer 283, an insulating layer 291, an insulating layer 293, an insulating layer 295, and the insulating layer 255.

Specific Example 2 includes the insulating layer 217 over the insulating layer 211. The space between the substrate 181 and the substrate 201 can be adjusted with the insulating layer 217.

FIG. 20A illustrates an example in which a light-receiving element is provided between the insulating layer 255 and the sealing layer 213. Since the light-receiving element can be placed to overlap with a non-light-emitting region (e.g., a region where the transistor 240 or a wiring is provided) on the substrate 201 side, the light-emitting panel can be provided with a touch sensor without a decrease in the aperture ratio of a pixel (light-emitting element).

As the light-receiving element included in the light-emitting panel, for example, a p-n photodiode or a p-i-n photodiode can be used. In this embodiment, a p-i-n photodiode including a p-type semiconductor layer 271, an i-type semiconductor layer 273, and an n-type semiconductor layer 275 is used as the light-receiving element.

Note that the i-type semiconductor layer 273 is a semiconductor in which the concentration of each of an impurity imparting p-type conductivity and an impurity imparting n-type conductivity is $1 \times 10^{20}$ cm$^{-3}$ or less and which has photoconductivity 100 times or more as high as dark conductivity. The i-type semiconductor layer 273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 273 includes, in its category, a semiconductor to which an impurity element imparting p-type conductivity is added intentionally or unintentionally at the time of deposition or after the deposition.

The light-blocking layer 257 is positioned above the light-emitting element 230 and overlaps with the light-receiving element. The light-blocking layer 257 between the light-receiving element and the sealing layer 213 can prevent the light-receiving element from being irradiated with light emitted from the light-emitting element 230.

The conductive layer 281 and the conductive layer 283 are electrically connected to the light-receiving element. The conductive layer 281 preferably transmits light incident on the light-receiving element. The conductive layer 283 preferably blocks light incident on the light-receiving element.

It is preferable to provide an optical touch sensor between the substrate 181 and the sealing layer 213 because the optical touch sensor is less likely to be affected by light emitted from the light-emitting element 230 and can have an improved S/N ratio.

<Specific Example 3>

Figure 20B:
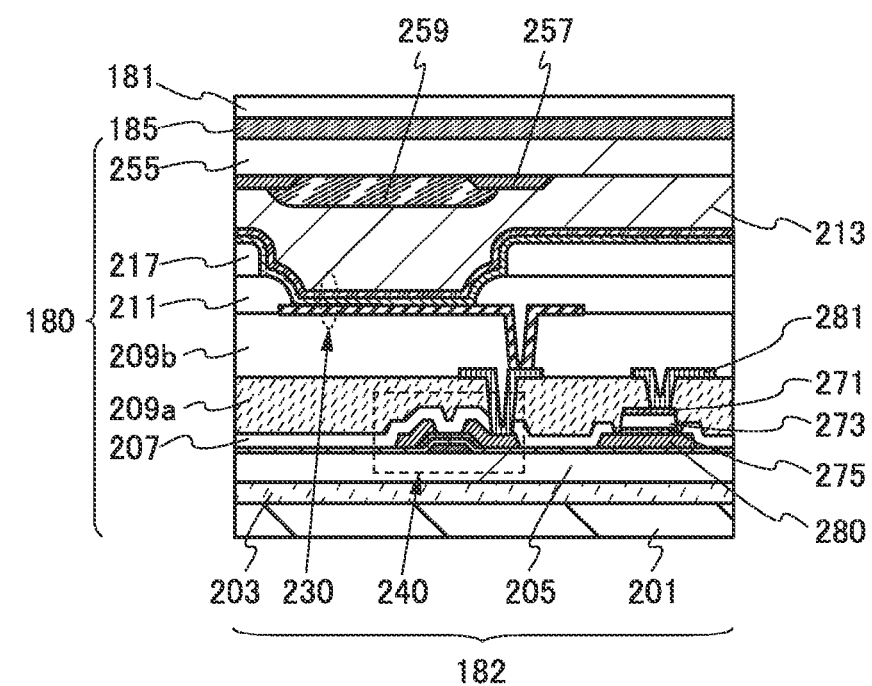

FIG. 20B illustrates another example of the light extraction portion 182 in the light-emitting panel. The light-emitting panel in FIG. 20B is capable of touch operation.

The light-emitting panel illustrated in FIG. 20B includes the element layer 180, the bonding layer 185, and the substrate 181. The element layer 180 includes the substrate 201, the bonding layer 203, the insulating layer 205, the plurality of transistors, the insulating layer 207, an insulating layer 209a, an insulating layer 209b, the plurality of light-emitting elements, the insulating layer 211, the insulating layer 217, the sealing layer 213, the coloring layer 259, the light-blocking layer 257, the plurality of light-receiving elements, a conductive layer 280, the conductive layer 281, and the insulating layer 255.

FIG. 20B illustrates an example in which a light-receiving element is provided between the insulating layer 205 and the sealing layer 213. Since the light-receiving element is provided between the insulating layer 205 and the sealing layer 213, a conductive layer to which the light-receiving element is electrically connected and a photoelectric conversion layer included in the light-receiving element can be formed using the same materials and the same step as a conductive layer and a semiconductor layer included in the transistor 240. Thus, the light-emitting panel capable of touch operation can be manufactured without a significant increase in the number of manufacturing steps.

<Specific Example 4>

Figure 21A:
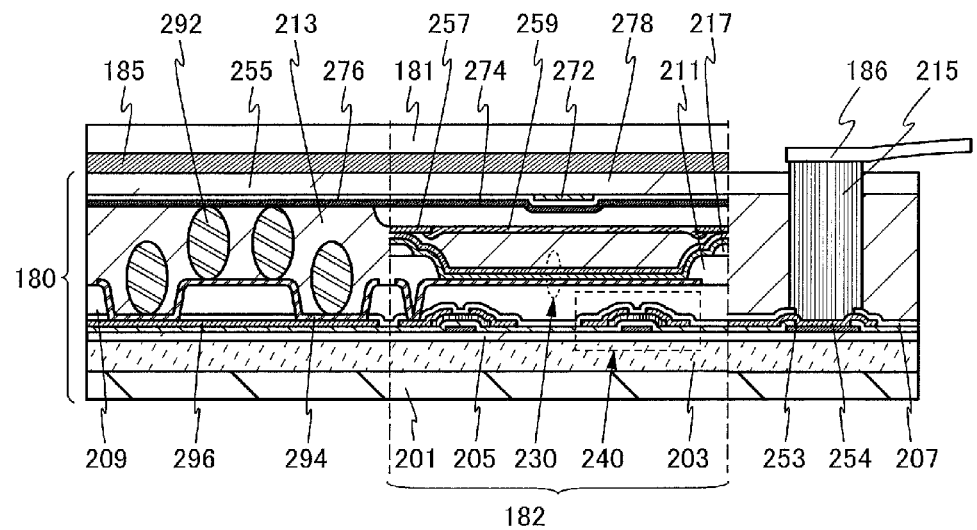
FIGS. 21A and 21B are cross-sectional views each illustrating a light-emitting panel that can be used in a data processing device.

FIG. 21A illustrates another example of the light-emitting panel. The light-emitting panel in FIG. 21A is capable of touch operation.

The light-emitting panel illustrated in FIG. 21A includes the element layer 180, the bonding layer 185, and the substrate 181. The element layer 180 includes the substrate 201, the bonding layer 203, the insulating layer 205, the plurality of transistors, a conductive layer 253, the conductive layer 254, the insulating layer 207, the insulating layer 209, the plurality of light-emitting elements, the insulating layer 211, the insulating layer 217, the sealing layer 213, the coloring layer 259, the light-blocking layer 257, the insulating layer 255, a conductive layer 272, a conductive layer 274, an insulating layer 276, an insulating layer 278, a conductive layer 294, and a conductive layer 296.

FIG. 21A illustrates an example in which a capacitive touch sensor is provided between the insulating layer 255 and the sealing layer 213. The capacitive touch sensor includes the conductive layer 272 and the conductive layer 274.

The conductive layer 253 and the conductive layer 254 are electrically connected to the FPC 186 via the connector 215. The conductive layer 294 and the conductive layer 296 are electrically connected to the conductive layer 274 via conductive particles 292. Thus, the capacitive touch sensor can be driven via the FPC 186.

<Specific Example 5>

Figure 21B:
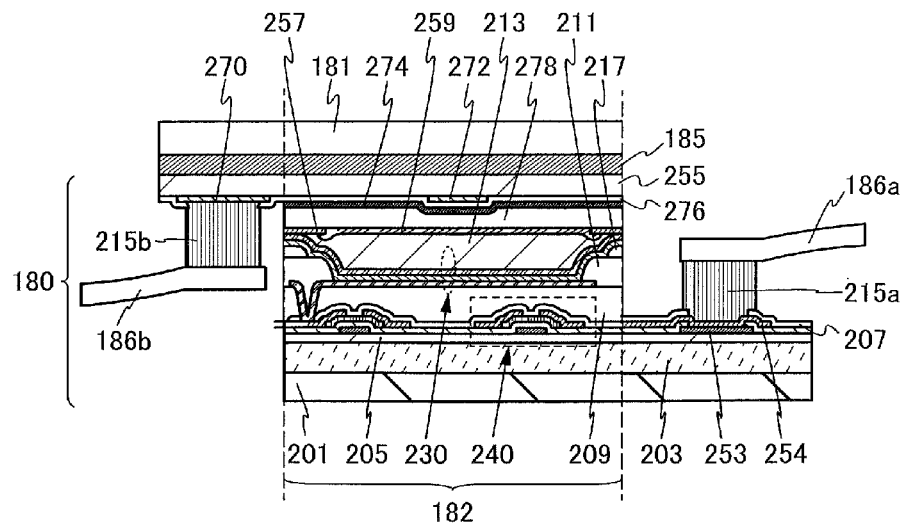

FIG. 21B illustrates another example of the light-emitting panel. The light-emitting panel in FIG. 21B is capable of touch operation.

The light-emitting panel illustrated in FIG. 21B includes the element layer 180, the bonding layer 185, and the substrate 181. The element layer 180 includes the substrate 201, the bonding layer 203, the insulating layer 205, the plurality of transistors, the conductive layer 253, the conductive layer 254, the insulating layer 207, the insulating layer 209, the plurality of light-emitting elements, the insulating layer 211, the insulating layer 217, the sealing layer 213, the coloring layer 259, the light-blocking layer 257, the insulating layer 255, a conductive layer 270, the conductive layer 272, the conductive layer 274, the insulating layer 276, and the insulating layer 278.

FIG. 21B illustrates an example in which a capacitive touch sensor is provided between the insulating layer 255 and the sealing layer 213. The capacitive touch sensor includes the conductive layer 272 and the conductive layer 274.

The conductive layer 253 and the conductive layer 254 are electrically connected to an FPC 186a via a connector 215a. The conductive layer 270 is electrically connected to an FPC 186b via a connector 215b. Thus, the light-emitting element 230 and the transistor 240 can be driven via the FPC 186a, and the capacitive touch sensor can be driven via the FPC 186b.

<Specific Example 6>

Figure 22A:
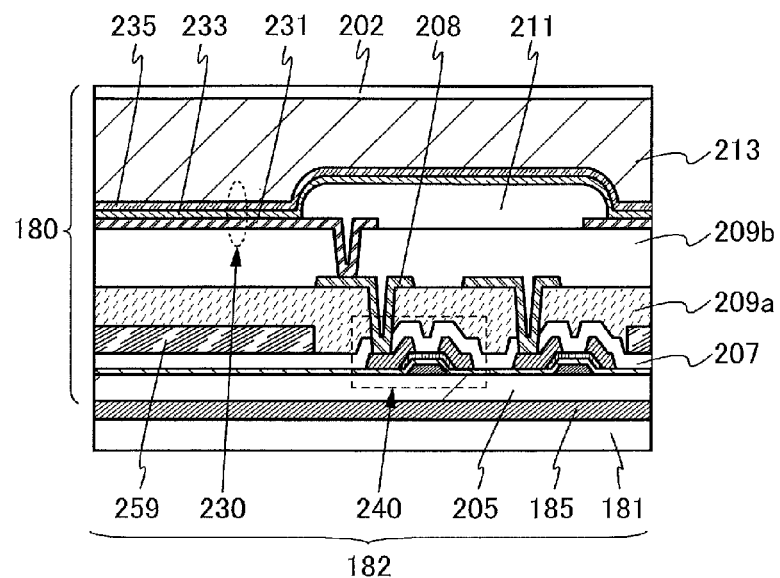
FIGS. 22A and 22B are cross-sectional views each illustrating a light-emitting panel that can be used in a data processing device.

FIG. 22A illustrates another example of the light extraction portion 182 in the light-emitting panel.

The light extraction portion 182 in FIG. 22A includes the substrate 181, the bonding layer 185, a substrate 202, the insulating layer 205, the plurality of transistors, the insulating layer 207, a conductive layer 208, the insulating layer 209a, the insulating layer 209b, the plurality of light-emitting elements, the insulating layer 211, the sealing layer 213, and the coloring layer 259.

The light-emitting element 230 includes the lower electrode 231, the EL layer 233, and the upper electrode 235. The lower electrode 231 is electrically connected to the source electrode or the drain electrode of the transistor 240 via the conductive layer 208. An end portion of the lower electrode 231 is covered with the insulating layer 211. The light-emitting element 230 has a top emission structure. The lower electrode 231 has a light-transmitting property and transmits light emitted from the EL layer 233.

The coloring layer 259 is provided to overlap with the light-emitting element 230, and light emitted from the light-emitting element 230 is extracted from the substrate 181 side through the coloring layer 259. The space between the light-emitting element 230 and the substrate 202 is filled with the sealing layer 213. The substrate 202 can be formed using a material similar to that of the substrate 201.

<Specific Example 7>

Figure 22B:
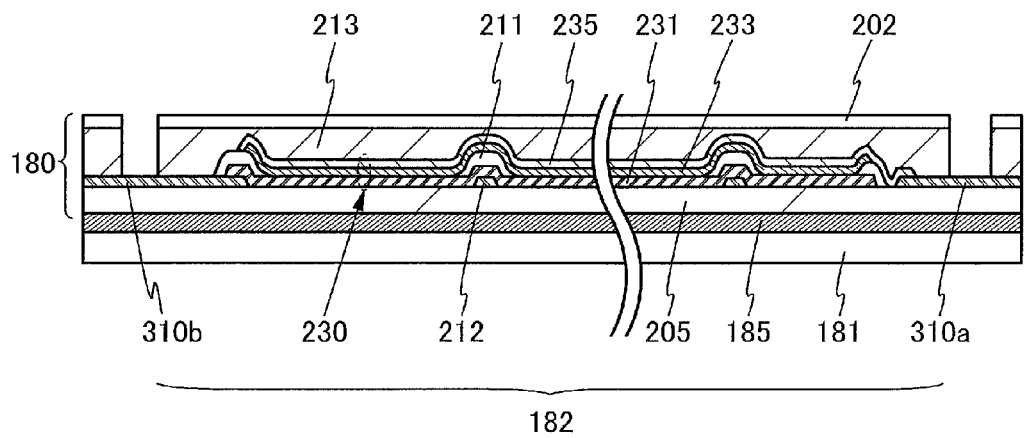

FIG. 22B illustrates another example of the light-emitting panel.

The light-emitting panel illustrated in FIG. 22B includes the element layer 180, the bonding layer 185, and the substrate 181. The element layer 180 includes the substrate 202, the insulating layer 205, a conductive layer 310a, a conductive layer 310b, the plurality of light-emitting elements, the insulating layer 211, a conductive layer 212, and the sealing layer 213.

The conductive layer 310a and the conductive layer 310b, which are external connection electrodes of the light-emitting panel, can each be electrically connected to an FPC or the like.

The light-emitting element 230 includes the lower electrode 231, the EL layer 233, and the upper electrode 235. An end portion of the lower electrode 231 is covered with the insulating layer 211. The light-emitting element 230 has a bottom emission structure. The lower electrode 231 has a light-transmitting property and transmits light emitted from the EL layer 233. The conductive layer 212 is electrically connected to the lower electrode 231.

The substrate 181 may have, as a light extraction structure, a hemispherical lens, a micro lens array, a film provided with an uneven surface structure, a light diffusing film, or the like. For example, the substrate 181 with a light extraction structure can be formed by attaching the above lens or film to a resin substrate with an adhesive or the like having substantially the same refractive index as the substrate or the lens or film.

The conductive layer 212 is preferably, though not necessarily, provided because voltage drop due to the resistance of the lower electrode 231 can be prevented. In addition, for a similar purpose, a conductive layer electrically connected to the upper electrode 235 may be provided over the insulating layer 211.

The conductive layer 212 can be a single layer or a stacked layer formed using a material selected from copper, titanium, tantalum, tungsten, molybdenum, chromium, neodymium, scandium, nickel, or aluminum, or an alloy material containing any of these materials as its main component. The thickness of the conductive layer 212 can be greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 235, metal particles forming the conductive layer aggregate; therefore, the surface of the conductive layer is rough and has many gaps. Thus, it is difficult for the EL layer 233 to completely cover the conductive layer, accordingly, the upper electrode and the conductive layer are preferably electrically connected to each other easily.

<Examples of Materials>

Next, materials and the like that can be used in a light-emitting panel are described. Note that description on the components already described in this embodiment is omitted.

The element layer 180 includes at least a light-emitting layer. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Among the above elements, the organic EL element is particularly preferable in terms of luminous efficiency and a manufacturing method.

The element layer 180 may further include a transistor for driving the light-emitting element, a touch sensor, or the like.

The structure of the transistors in the light-emitting panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one metal of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the light-emitting panel includes a pair of electrodes (the lower electrode 231 and the upper electrode 235); and the EL layer 233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium: an alloy containing any of these metal materials; or a nitride of any of these metal materials (e.g., titanium nitride) can be formed thin so as to have a light-transmitting property. Further alternatively, a stack of any of the above materials can be used as the conductive layer. For example, a stacked film of ITO and an alloy of silver and magnesium is preferably used, in which case conductivity can be increased. Further still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Moreover, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium can be used for the conductive film. An alloy of silver and copper is preferable because of its high heat resistance. Furthermore, when a metal film or a metal oxide film is stacked on and in contact with an aluminum alloy film, oxidation of the aluminum alloy film can be prevented. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 231 and the upper electrode 235, holes are injected to the EL layer 233 from the anode side and electrons are injected to the EL layer 233 from the cathode side. The injected electrons and holes are recombined in the EL layer 233 and a light-emitting substance contained in the EL layer 233 emits light.

The EL layer 233 includes at least a light-emitting layer. In addition to the light-emitting layer, the EL layer 233 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 233, either a low molecular compound or a high molecular compound can be used, and an inorganic compound may also be used. Each of the layers included in the EL layer 233 can be formed by any of the following methods: an evaporation method (including a vacuum evaporation method), a transfer method, a printing method, an ink-jet method, a coating method, and the like.

In the element layer 180, the light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

The substrate 181 has a light-transmitting property and transmits at least light emitted from the light-emitting element included in the element layer 180. The substrate 181 may be a flexible substrate. Moreover, the refractive index of the substrate 181 is higher than that of the air.

An organic resin, which is lightweight than glass, is preferably used for the substrate 181, in which case the light-emitting device can be more lightweight as compared to the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferable, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 181 may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-described materials. Furthermore, to suppress a decrease in the lifetime of the light-emitting element due to moisture and the like, the insulating film with low water permeability may be included in the stacked-layer structure.

The bonding layer 185 has a light-transmitting property and transmits at least light emitted from the light-emitting element included in the element layer 180. Moreover, the refractive index of the bonding layer 185 is higher than that of the air.

For the bonding layer 185, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferable.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because entry of an impurity such as moisture into the light-emitting element can be suppressed, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 185 may also include a scattering member for scattering light. For example, the bonding layer 185 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 205 and the insulating layer 255 can each be formed using an inorganic insulating material. It is particularly preferable to use the insulating film with low water permeability, in which case a highly reliable light-emitting panel can be provided.

The insulating layer 207 has an effect of preventing diffusion of impurities into a semiconductor included in the transistor. As the insulating layer 207, an inorganic insulating film such as a silicon oxide film, a silicon oxynitride film, or an aluminum oxide film can be used.

As each of the insulating layers 209, 209a, and 209b, an insulating film with a planarization function is preferably selected in order to reduce surface unevenness due to the transistor or the like. For example, an organic material such as a polyimide-based resin, an acrylic-based resin, or a benzocyclobutene-based resin can be used. As an alternative to such an organic material, a low-dielectric constant material (a low-k material) or the like can be used. Note that a plurality of insulating films formed of these materials or inorganic insulating films may be stacked.

The insulating layer 211 is provided to cover an end portion of the lower electrode 231. In order that the insulating layer 211 be favorably covered with the EL layer 233 and the upper electrode 235 formed thereover, a sidewall of the insulating layer 211 preferably has a tilted surface with continuous curvature.

As a material for the insulating layer 211, a resin or an inorganic insulating material can be used. As the resin, for example, a polyimide-based resin, a polyamide-based resin, an acrylic-based resin, a siloxane-based resin, an epoxy-based resin, a phenol-based resin, or the like can be used. In particular, either a negative photosensitive resin or a positive photosensitive resin is preferably used for easy formation of the insulating layer 211.

There is no particular limitation on the method for forming the insulating layer 211; a photolithography method, a sputtering method, an evaporation method, a droplet discharge method (e.g., an ink-jet method), a printing method (e.g., a screen printing method or an off-set printing method), or the like may be used.

The insulating layer 217 can be formed using an inorganic insulating material, an organic insulating material, a metal material, or the like. As the organic insulating material, for example, a negative or positive photosensitive resin, a non-photosensitive resin, or the like can be used. As the metal material, titanium, aluminum, or the like can be used. When a conductive material is used for the insulating layer 217 and the insulating layer 217 is electrically connected to the upper electrode 235, voltage drop due to the resistance of the upper electrode 235 can be prevented. The insulating layer 217 may have either a tapered shape or an inverse tapered shape.

Each of the insulating layers 276, 278, 291, 293, and 295 can be formed using an inorganic insulating material or an organic insulating material. It is particularly preferable to use an insulating layer with a planarization function for each of the insulating layers 278 and 295 in order to reduce surface unevenness due to a sensor element.

For the bonding layer 213, a resin that is curable at room temperature such as a two-component type resin, a light-curable resin, a heat-curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 213. In the case where light emitted from the light-emitting element 230 is extracted outside the light-emitting panel through the sealing layer 213, the sealing layer 213 preferably includes a filler with a high refractive index or a scattering member. Materials for the drying agent, the filler with a high refractive index, and the scattering member are similar to those that can be used for the bonding layer 185.

Each of the conductive layers 253, 254, 294, and 296 can be formed using the same material and the same step as a conductive layer included in the transistor or the light-emitting element. The conductive layer 280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 208, 212, 310a, and 310b can also be formed using any of the above metal materials, alloy materials, and conductive metal oxides.

Each of the conductive layers 272, 274, 281, and 283 is a conductive layer having a light-transmitting property. The conductive layer can be formed using, for example, indium oxide, ITO, indium zinc oxide, zinc oxide, zinc oxide to which gallium is added, or the like. The conductive layer 270 can be formed using the same material and the same step as the conductive layer 272.

As the conductive particles 292, particles of an organic resin, silica, or the like coated with a metal material are used. It is preferable to use nickel or gold as the metal material because contact resistance can be decreased. It is also preferable to use particles each coated with layers of two or more kinds of metal materials, such as particles coated with nickel and further with gold.

For the connector 215, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of a variety of materials by a printing method, an ink-jet method, an etching method using a photolithography method, or the like.

The light-blocking layer 257 is provided between the adjacent coloring layers 259. The light-blocking layer 257 blocks light emitted from the adjacent light-emitting element, thereby preventing color mixture between adjacent pixels. Here, the coloring layer 259 is provided such that its end portion overlaps with the light-blocking layer 257, whereby light leakage can be reduced. The light-blocking layer 257 can be formed using a material that blocks light emitted from the light-emitting element, for example, a metal material, a resin material including a pigment or a dye, or the like. Note that the light-blocking layer 257 is preferably provided in a region other than the light extraction portion 182, such as the driver circuit portion 184, as illustrated in FIG. 19A, in which case undesired leakage of guided light or the like can be prevented.

The insulating layer 261 covering the coloring layer 259 and the light-blocking layer 257 is preferably provided because it can prevent an impurity such as a pigment included in the coloring layer 259 or the light-blocking layer 257 from diffusing into the light-emitting element or the like. For the insulating layer 261, a light-transmitting material is used, and an inorganic insulating material or an organic insulating material can be used. The insulating film with low water permeability may be used for the insulating layer 261.

<Manufacturing Method Example>

Next, an example of a manufacturing method of a light-emitting panel is described with reference to FIGS. 23A to 23C and FIGS. 24A to 24C. Here, the manufacturing method is described using the light-emitting panel of Specific Example 1 (FIG. 19B) as an example.

First, a separation layer 303 is formed over a formation substrate 301, and the insulating layer 205 is formed over the separation layer 303. Next, the plurality of transistors, the conductive layer 254, the insulating layer 207, the insulating layer 209, the plurality of light-emitting elements, and the insulating layer 211 are formed over the insulating layer 205.

Figure 23A:
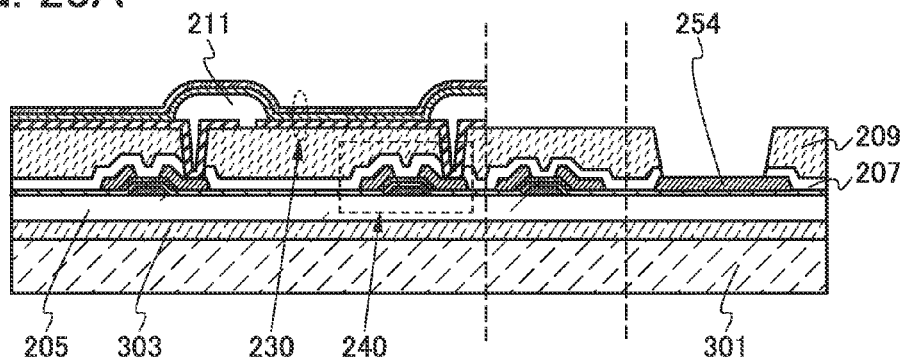
FIGS. 23A to 23C are cross-sectional views illustrating a manufacturing method of a light-emitting panel that can be used in a data processing device.

An opening is formed in the insulating layers 211, 209, and 207 to expose the conductive layer 254 (FIG. 23A).

Figure 23B:
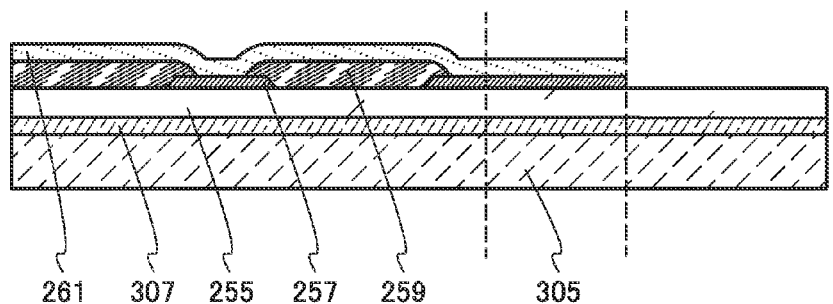

In addition, a separation layer 307 is formed over a formation substrate 305, and the insulating layer 255 is formed over the separation layer 307. Next, the light-blocking layer 257, the coloring layer 259, and the insulating layer 261 are formed over the insulating layer 255 (FIG. 23B).

The formation substrate 301 and the formation substrate 305 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Note that when containing a large amount of barium oxide (BaO), the glass substrate can be heat-resistant and more practical. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 303 and the separation layer 307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide (N$_2$O) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that alternatively, an insulating layer may be provided between the insulating layer 205 or the insulating layer 255, and the separation layer so that separation can be performed at an interface between the insulating layer, and the insulating layer 205 or the insulating layer 255. The insulating layer preferably has a single-layer structure or a stacked-layer structure including any of a silicon nitride film, a silicon oxynitride film, a silicon nitride oxide film, and the like.

Each of the insulating layers can be formed by a sputtering method, a plasma CVD method, a coating method, a printing method, or the like. For example, the insulating layer is formed at a temperature higher than or equal to 250° C., and lower than or equal to 400° C. by a plasma CVD method, whereby the insulating layer can be a dense film with very low water permeability.

Figure 23C:
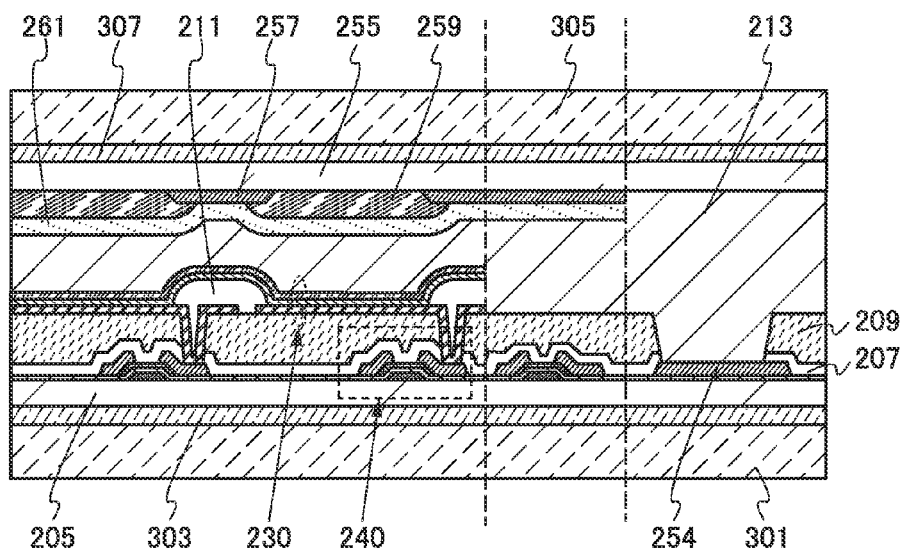

Then, a material for the sealing layer 213 is applied to a surface of the formation substrate 305 over which the coloring layer 259 and the like are formed or a surface of the formation substrate 301 over which the light-emitting element 230 and the like are formed, and the formation substrate 301 and the formation substrate 305 are attached so that these two surfaces face each other with the sealing layer 213 positioned therebetween (FIG. 23C).

Next, the formation substrate 301 is separated, and the exposed insulating layer 205 and the substrate 201 are attached to each other with the bonding layer 203. Furthermore, the formation substrate 305 is separated, and the exposed insulating layer 255 and the substrate 181 are attached to each other with the bonding layer 185. Although the substrate 181 does not overlap with the conductive layer 254 in FIG. 24A, the substrate 181 may overlap with the conductive layer 254.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate with high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is further removed by etching using a solution or a fluoride gas such as NF$_3$, BrF$_3$, or ClF$_3$, whereby the separation can be performed at the embrittled metal oxide film. Further alternatively, a method carried out as follows may be employed: a film containing nitrogen, oxygen, hydrogen, or the like (e.g., an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Furthermore, the separation process can be performed easily by combination of the above-described separation methods. In other words, separation can be performed with physical force (by a machine or the like) after performing laser light irradiation, etching on the separation layer with a gas, a solution, or the like, or mechanical removal with a sharp knife, a scalpel or the like so that the separation layer and the layer to be separated can be easily separated from each other.

Separation of the layer to be separated from the formation substrate may be performed by filling the interface between the separation layer and the layer to be separated with a liquid. Furthermore, the separation may be performed while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 24A:
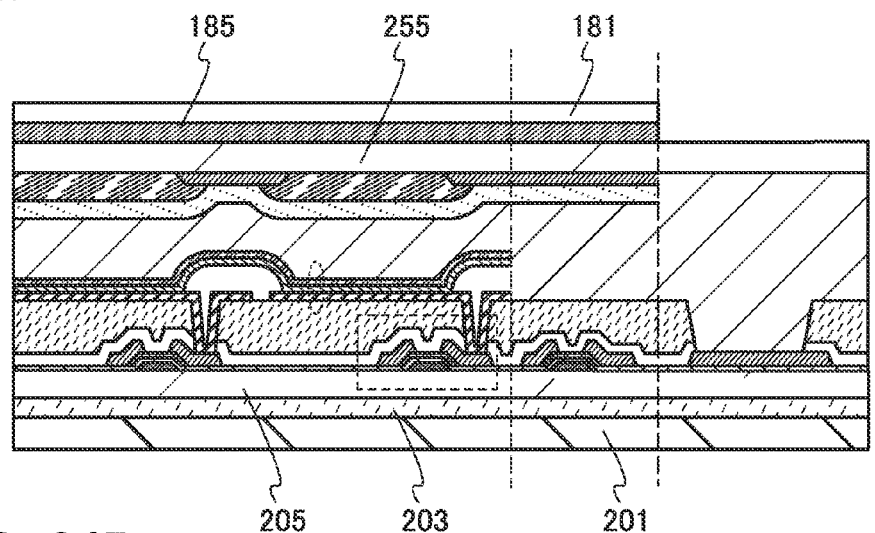
FIGS. 24A to 24C are cross-sectional views illustrating a manufacturing method of a light-emitting panel that can be used in a data processing device.
Figure 24B:
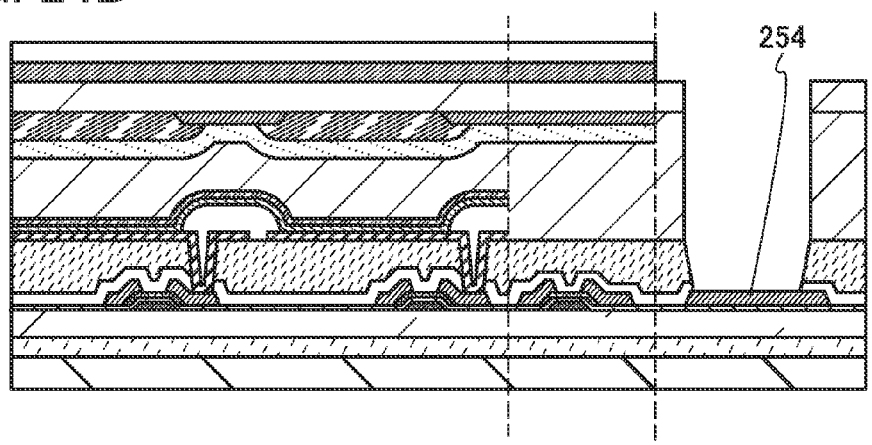
Figure 24C:
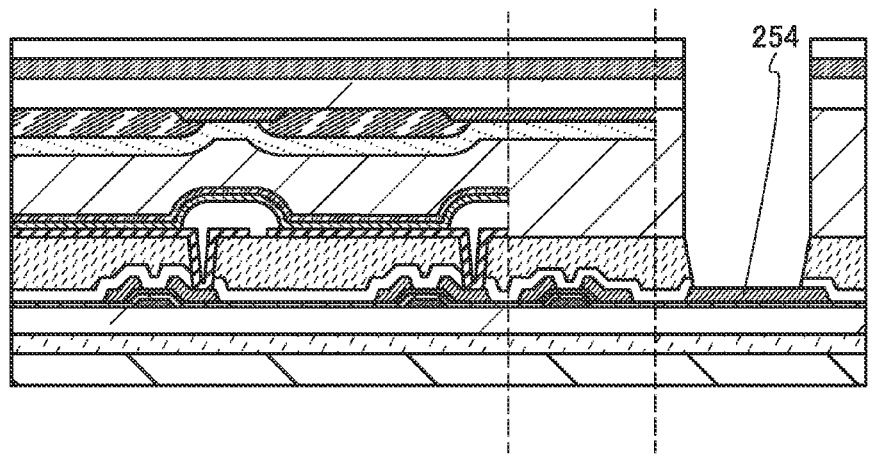

Lastly, an opening is formed in the insulating layer 255 and the sealing layer 213 to expose the conductive layer 254 (FIG. 24B). In the case where the substrate 181 overlaps with the conductive layer 254, the opening is formed also in the substrate 181 and the bonding layer 185 (FIG. 24C). The method for forming the opening is not particularly limited and may be, for example, a laser ablation method, an etching method, an ion beam sputtering method, or the like. As another method, a cut may be made in a film over the conductive layer 254 with a sharp knife or the like and part of the film may be separated by physical force.

In the above-described manner, the light-emitting panel can be manufactured.

As described above, a light-emitting panel of this embodiment includes two substrates; one is the substrate 181 and the other is the substrate 201 or the substrate 202. The light-emitting panel can be formed with two substrates even when including a touch sensor. Owing to the use of the minimum number of substrates, improvement in light extraction efficiency and improvement in clarity of display can be easily achieved.

This embodiment can be combined as appropriate with any of the other embodiments in this specification.

[Embodiment 4]

In this embodiment, a light-emitting panel that can be used in the data processing device will be described with reference to FIG. 25.

Figure 25:
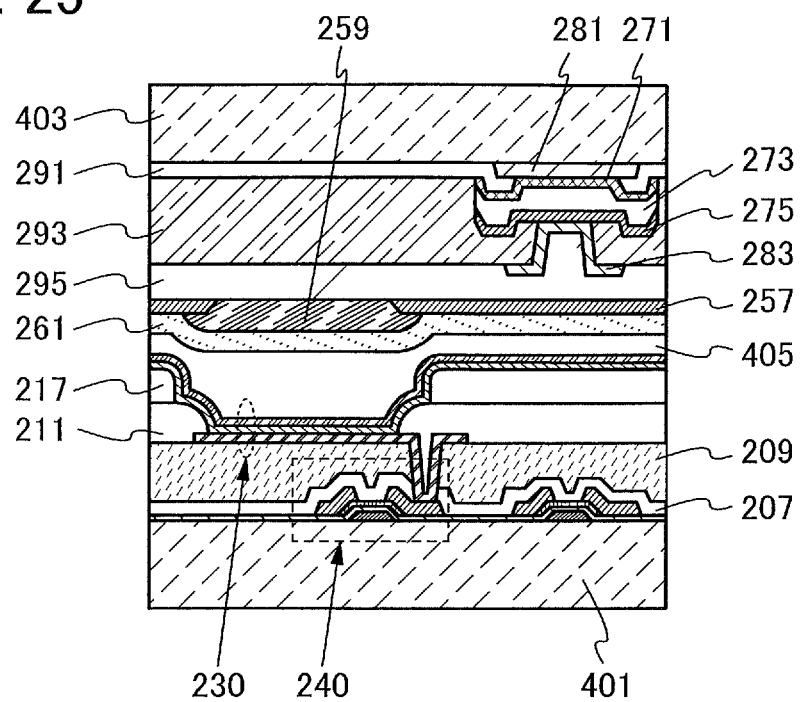
FIG. 25 is a cross-sectional view illustrating a light-emitting panel that can be used in a data processing device.

The light-emitting panel illustrated in FIG. 25 includes a substrate 401, the transistor 240, the light-emitting element 230, the insulating layer 207, the insulating layer 209, the insulating layer 211, the insulating layer 217, a space 405, the insulating layer 261, the light-blocking layer 257, the coloring layer 259, a light-receiving element (including the p-type semiconductor layer 271, the i-type semiconductor layer 273, and the n-type semiconductor layer 275), the conductive layer 281, the conductive layer 283, the insulating layer 291, the insulating layer 293, the insulating layer 295, and a substrate 403.

The light-emitting panel includes a bonding layer (not illustrated) formed in a frame shape between the substrate 401 and the substrate 403 to surround the light-emitting element 230 and the light-receiving element. The light-emitting element 230 is sealed by the bonding layer, the substrate 401, and the substrate 403.

In the light-emitting panel of this embodiment, the substrate 403 has a light-transmitting property. Light emitted from the light-emitting element 230 is extracted to the air through the coloring layer 259, the substrate 403, and the like.

The light-emitting panel of this embodiment is capable of touch operation. Specifically, proximity or contact of an object on a surface of the substrate 403 can be sensed with the light-receiving element.

An optical touch sensor is highly durable and preferable because its sensing accuracy is not affected by damage to a surface that is touched by an object. An optical touch sensor is also advantageous in that it is capable of noncontact sensing, it does not degrade the clarity of images even when used in a display device, and it is applicable to large-sized light-emitting panels and display devices.

It is preferable to provide an optical touch sensor between the substrate 403 and the space 405 because the optical touch sensor is less likely to be affected by light emitted from the light-emitting element 230 and can have an improved S/N ratio.

The light-blocking layer 257 is positioned above the light-emitting element 230 and overlaps with the light-receiving element. The light-blocking layer 257 can prevent the light-receiving element from being irradiated with light emitted from the light-emitting element 230.

There is no particular limitation on materials used for the substrates 401 and 403. The substrate through which light emitted from the light-emitting element is extracted is formed using a material that transmits the light. For example, a material such as glass, quartz, ceramics, sapphire, or an organic resin can be used. Since the substrate through which light emission is not extracted does not need to have a light-transmitting property, a metal substrate using a metal material or an alloy material or the like can be used in addition to the above-described substrates. Furthermore, any of the materials for the substrates given in the above embodiments can also be used for the substrates 401 and 403.

A method for sealing the light-emitting panel is not limited, and either solid sealing or hollow sealing can be employed. For example, a glass material such as a glass frit, or a resin material such as a resin that is curable at room temperature such as a two-component type resin, a light curable resin, or a thermosetting resin can be used. The space 405 may be filled with an inert gas such as nitrogen or argon, or with a resin or the like similar to that used for the sealing layer 213. Furthermore, the resin may include the drying agent, the filler with a high refractive index, or the scattering member.

This embodiment can be combined as appropriate with any of the other embodiments in this specification.

REFERENCE NUMERALS

100: data processing device, 102: display portion, 102*a*: display portion, 102*b*: display portion, 104: driver circuit portion, 104g_1: gate driver, 104g_1A: gate driver, 104g_1B: gate driver, 104g_2: gate driver, 104g2A: gate driver, 104g_2B: gate driver, 104g_2C: gate driver, 104g_2D: gate driver, 104g_3: gate driver, 104g_4: gate driver, 104g_5: gate driver, 104s_1: source driver, 104s_2: source driver, 104s_3: source driver, 104s_4: source driver, 105: display panel, 106: sensor portion, 108: arithmetic portion, 110: memory portion, 120: region, 150: data processing device, 152: display panel, 153a: support panel, 155a: support panel, 155b: support panel, 180: element layer, 181: substrate, 182: light extraction portion, 184: driver circuit portion, 185: bonding layer, 186: FPC, 186a: FPC, 186b: FPC, 201: substrate, 202: substrate, 203: bonding layer, 205: insulating layer, 207: insulating layer, 208: conductive layer, 209: insulating layer, 209a: insulating layer, 209b: insulating layer, 211: insulating layer, 212: conductive layer, 213: sealing layer, 215: connector, 215a: connector, 215b: connector, 217: insulating layer, 230: light-emitting element, 231: lower electrode, 233: EL layer, 235: upper electrode, 240: transistor, 253: conductive layer, 254: conductive layer, 255: insulating layer, 257: light-blocking layer, 259: coloring layer, 261: insulating layer, 270: conductive layer, 271: p-type semiconductor layer, 272: conductive layer, 273: i-type semiconductor layer, 274: conductive layer, 275: n-type semiconductor layer, 276: insulating layer, 278: insulating layer, 280: conductive layer, 281: conductive layer, 283: conductive layer, 291: insulating layer, 292: conductive particles, 293: insulating layer, 294: conductive layer, 295: insulating layer, 296: conductive layer, 301: formation substrate, 303: separation layer, 305: formation substrate, 307: separation layer, 310a: conductive layer, 310b: conductive layer, 401: substrate, 403: substrate, 405: space, 901: transistor, 902: capacitor, 903: transistor, 904: light-emitting element, 905: wiring, 906: wiring, 907: wiring, 907A: wiring, 907B: wiring, 907C: wiring, 907D: wiring, 907E: wiring, 907F: wiring, 908: wiring, 909: pixel, 911: circuit, 912: source driver circuit, 913: circuit, 913A: gate driver, 913B: gate driver, 914: gate driver, 915: circuit, 916: circuit, 916A: circuit, 916B: circuit, 917A: switch, 917B: switch, 917C: switch, 917D: switch, 917E: switch, 917F: switch, 918: wiring, 918A: wiring, 918B: wiring, 919: AND circuit, 920: wiring, 921: circuit, 922: AND circuit, 923: wiring.

This application is based on Japanese Patent Application serial no. 2013-150586 filed with Japan Patent Office on Jul. 19, 2013, the entire contents of which are hereby incorporated by reference.

The invention claimed is:

1. A data processing device comprising:
a display portion comprising flexibility;
a touch sensor comprising a first conductive layer;
a plurality of drivers arranged in a periphery of the display portion;
a sensor portion configured to discern an external state of the display portion;
an arithmetic portion configured to supply image data to the plurality of drivers; and
a memory portion configured to store a program executed by the arithmetic portion,
wherein the first conductive layer is electrically connected to a second conductive layer via a conductive particle,
wherein the first conductive layer is a conductive layer having a light-transmitting property,
wherein the second conductive layer is a metal layer,
wherein a first mode in which the display portion is unfolded or a second mode in which the display portion is folded is sensed by the sensor portion,
wherein when the display portion is folded, a first region of the display portion is unexposed and a second region of the display portion is exposed,
wherein low power consumption processing is performed on the first region of the display portion, and
wherein degradation correction processing is performed by controlling amount of current flowing through one of the first region and the second region of the display portion to inhibit display unevenness.

2. The data processing device according to claim 1, the program comprising:
a first step of specifying the external state;
a second step in which the program judges whether the external state is the first mode and proceeds to a fourth step in the case of the first mode or a third step in the case of a mode other than the first mode;
the third step in which the program judges whether the external state is the second mode and proceeds to a fifth step in the case of the second mode or the first step in the case of a mode other than the second mode;
the fourth step in which the program proceeds to a sixth step in the case where the degradation correction processing is necessary or a seventh step in the case where the degradation correction processing is not necessary;
the fifth step of carrying out the low power consumption processing;
the sixth step of carrying out the degradation correction processing; and
the seventh step of terminating the program,
wherein the low power consumption processing comprises:
an eighth step of deciding a non-display region;
a ninth step of stopping at least one of the plurality of drivers;
a tenth step of measuring time during which at least one of the plurality of drivers is stopped;
an eleventh step in which the program proceeds to a twelfth step in the case where the low power consumption processing is canceled or the ninth step in the case where the low power consumption processing is not canceled; and
the twelfth step of recovering from the low power consumption processing to the program, and
wherein the degradation correction processing comprises:
a thirteenth step of specifying time of a display region subjected to the low power consumption processing;
a fourteenth step of controlling the amount of current flowing through the display region subjected to the low power consumption processing;
a fifteenth step in which the program proceeds to a sixteenth step in the case where the degradation correction processing is canceled or the fourteenth step in the case where the degradation correction processing is not canceled; and
the sixteenth step of recovering from the degradation correction processing to the program.

3. The data processing device according to claim 1,
wherein the display portion and the plurality of drivers are formed over a same substrate, and
wherein the plurality of drivers are independently formed in regions other than a folded region.

4. The data processing device according to claim 1, wherein the display portion comprises a light-emitting element.

5. The data processing device according to claim 1, wherein the display portion comprises an organic EL element.

6. A data processing device comprising:
a display portion comprising flexibility;
a touch sensor comprising a first conductive layer;
a first driver, a second driver and a third driver arranged in a periphery of the display portion;
a sensor portion configured to discern an external state of the display portion;
an arithmetic portion configured to supply image data to the first driver, the second driver and the third driver; and
a memory portion configured to store a program executed by the arithmetic portion,
wherein the first conductive layer is electrically connected to a second conductive layer via a conductive particle,
wherein the first conductive layer is a conductive layer having a light-transmitting property,
wherein the second conductive layer is a metal layer,
wherein the display portion is configured to be folded at a first fold between the first driver and the second driver and a second fold between the second driver and the third driver,
wherein a first mode in which the display portion is unfolded or a second mode in which the display portion is folded is sensed by the sensor portion,
wherein when the display portion is folded, a first region of the display portion is unexposed and a second region of the display portion is exposed,
wherein low power consumption processing is performed on the first region of the display portion, and
wherein degradation correction processing is performed by controlling amount of current flowing through one of the first region and the second region of the display portion to inhibit display unevenness.

7. The data processing device according to claim 6, the program comprising:
a first step of specifying the external state;
a second step in which the program judges whether the external state is the first mode and proceeds to a fourth step in the case of the first mode or a third step in the case of a mode other than the first mode;
the third step in which the program judges whether the external state is the second mode and proceeds to a fifth step in the case of the second mode or the first step in the case of a mode other than the second mode;
the fourth step in which the program proceeds to a sixth step in the case where the degradation correction processing is necessary or a seventh step in the case where the degradation correction processing is not necessary;
the fifth step of carrying out the low power consumption processing;
the sixth step of carrying out the degradation correction processing; and
the seventh step of terminating the program,
wherein the low power consumption processing comprises:
an eighth step of deciding a non-display region;
a ninth step of stopping at least one of the first driver, the second driver and the third driver;
a tenth step of measuring time during which at least one of the first driver, the second driver and the third driver is stopped;
an eleventh step in which the program proceeds to a twelfth step in the case where the low power consumption processing is canceled or the ninth step in the case where the low power consumption processing is not canceled; and
the twelfth step of recovering from the low power consumption processing to the program, and
wherein the degradation correction processing comprises:
a thirteenth step of specifying time of a display region subjected to the low power consumption processing;
a fourteenth step of controlling the amount of current flowing through the display region subjected to the low power consumption processing;
a fifteenth step in which the program proceeds to a sixteenth step in the case where the degradation correction processing is canceled or the fourteenth step in the case where the degradation correction processing is not canceled; and
the sixteenth step of recovering from the degradation correction processing to the program.

8. The data processing device according to claim 6,
wherein the display portion, the first driver, the second driver and the third driver are formed over a same substrate, and
wherein the first driver, the second driver and the third driver are independently formed in regions other than a folded region.

9. The data processing device according to claim 6, wherein the display portion comprises a light-emitting element.

10. The data processing device according to claim 6, wherein the display portion comprises an organic EL element.

* * * * *